United States Patent
Iguchi

(10) Patent No.: US 7,960,799 B2
(45) Date of Patent: Jun. 14, 2011

(54) SEMICONDUCTOR DEVICE AND METHOD FOR MANUFACTURING THE SAME

(75) Inventor: Tadashi Iguchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1 day.

(21) Appl. No.: 12/420,584

(22) Filed: Apr. 8, 2009

(65) Prior Publication Data

US 2009/0267138 A1    Oct. 29, 2009

(30) Foreign Application Priority Data

Apr. 28, 2008   (JP) .................. 2008-117655

(51) Int. Cl.
*H01L 27/115* (2006.01)
*H01L 21/762* (2006.01)

(52) U.S. Cl. ............. 257/397; 257/411; 257/E29.309; 257/E21.423; 438/287; 438/288; 438/296; 438/424

(58) Field of Classification Search .............. 438/287, 438/288, 296, 424, FOR. 220; 257/397, 257/411, E29.309, E21.423
See application file for complete search history.

(56) References Cited

U.S. PATENT DOCUMENTS

| | | | |
|---|---|---|---|
| 6,995,424 B2 | 2/2006 | Lee | |
| 7,081,386 B2 | 7/2006 | Ozawa et al. | |
| 7,498,217 B2 * | 3/2009 | Oh et al. | 438/201 |
| 7,645,668 B2 * | 1/2010 | Kim et al. | 438/257 |
| 7,816,726 B2 * | 10/2010 | He et al. | 257/324 |
| 2006/0043456 A1 * | 3/2006 | Derderian et al. | 257/314 |
| 2007/0126054 A1 | 6/2007 | Jung | |
| 2008/0230830 A1 * | 9/2008 | Kim et al. | 257/324 |
| 2009/0053871 A1 * | 2/2009 | Ahn | 438/287 |
| 2009/0212347 A1 * | 8/2009 | Goarin et al. | 257/324 |
| 2009/0251972 A1 * | 10/2009 | He et al. | 365/185.28 |

FOREIGN PATENT DOCUMENTS

JP    2007-142468    6/2007

* cited by examiner

*Primary Examiner* — George Fourson
(74) *Attorney, Agent, or Firm* — Finnegan, Henderson, Farabow, Garrett & Dunner, L.L.P.

(57) ABSTRACT

A charge trap type non-volatile memory device has memory cells formed on a silicon substrate at a predetermined interval via an element isolation trench along a first direction in which word lines extend. Each of the memory cells has a tunnel insulating film formed on the silicon substrate, a charge film formed on the tunnel insulating film, and a common block film formed on the charge film. The common block film is formed in common with the memory cells along first direction. An element isolation insulating film buried in the element isolation trench has an upper portion of a side wall of the element isolation insulating film which contacts with a side wall of the charge film in each of the memory cells and a top portion of the element isolation insulating film which contacts with the common block film. A control electrode film is formed on the common block film.

20 Claims, 18 Drawing Sheets

FIG. 1-1
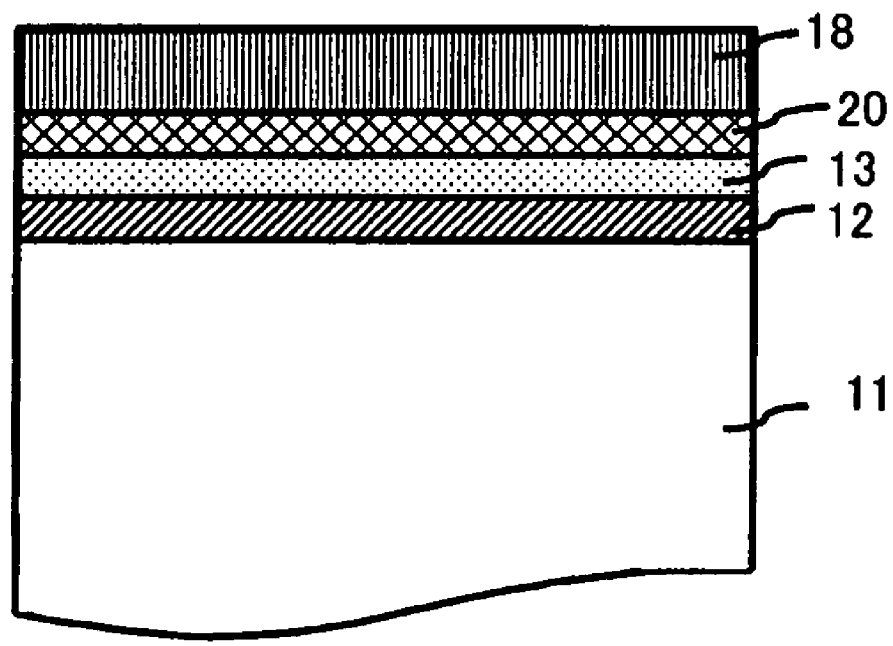
FIG. 1-2

SEMICONDUCTOR DEVICE AND METHOD FOR MANUFACTURING THE SAME

CROSS REFERENCE TO RELATED APPLICATIONS

This application is based upon and claims the benefit of priority from prior Japanese Patent Applications No. 2008-117655, filed on Apr. 28, 2008, the entire contents of which are incorporated herein by reference.

BACKGROUND OF THE INVENTION

1. Field of the Invention

The present invention relates to a charge trap type non-volatile memory device and a method for manufacturing the charge trap type non-volatile memory device.

2. Background Art

A charge trap type non-volatile memory device is known as a kind of non-volatile memory devices capable of electrically writing, reading and erasing data (for example, Japanese Patent Laid-Open No. 2007-142468). This charge trap type non-volatile memory device has a plurality of memory cells and performs the writing of data by causing electric charges to be trapped in charge films (silicon nitride films).

In recent years, miniaturization has gone ahead in charge trap type non-volatile memory devices, and as a result of this, memory cells adjacent to each other come closer to each other than before, with the result that the mutual interference of memory cells has become great. If the mutual interference becomes great, it becomes difficult to obtain memory cells having good writing and reading characteristics.

Therefore, it is necessary to more positively reduce the mutual interference of memory cells.

In a charge trap type non-volatile memory device, in the case of formation of a shallow trench isolation (STI) structure that performs element isolation by burying a trench insulating film between a pair of memory cells adjacent to each other, it is effective to lower the height of the buried insulating film in order to reduce the mutual interference of the adjacent memory cells. The reason for this is that because the capacitance between the adjacent memory cells can be reduced by lowering the height of the above-described buried insulating film, this leads to a reduction in the mutual interference of the adjacent memory cells.

SUMMARY OF THE INVENTION

According to an aspect of an embodiment of the present invention, there is provided a charge trap type non-volatile memory device comprising: memory cells formed on a silicon substrate at a predetermined interval via an element isolation trench along a first direction in which word lines extend, each of the memory cells having a tunnel insulating film formed on the silicon substrate, a charge film formed on the tunnel insulating film, and a common block film formed on the charge film, wherein the common block film is formed in common with the memory cells along first direction, an element isolation insulating film buried in the element isolation trench between the memory cells, having an upper portion of a side wall of the element isolation insulating film which contacts with a side wall of the charge film in each of the memory cells, and a top portion of the element isolation insulating film which contacts with the common block film, and a control electrode film being formed on the common block film that extends along the first direction.

According to another aspect of an embodiment of the present invention, there is provided a method for manufacturing a charge trap type non-volatile memory device having memory cells formed on a silicon substrate at a predetermined interval via an element isolation trench along a first direction in which word lines extend, comprising: stacking at least a tunnel insulating film material, a charge film material, and a buffer film material on the silicon substrate; forming the element isolation trenches that extend from the buffer film material to the silicon substrate by etching the buffer film material, the charge film material, the tunnel insulating film material, and the silicon substrate; forming each of the memory cells as a memory cell having a tunnel insulating film, a charge film, and a buffer film that covers the charge film; depositing an element isolation insulating film in each of the element isolation trenches; etching each of the element isolation insulating films so that an upper surface of each of the element isolation insulating films comes near to an interface between each of the buffer films and each of the charge films; removing each of the buffer films; and etching each of the element isolation insulating films so that an upper portion of a side wall of each of the element isolation insulating films contacts with a side wall of the charge film in each of the memory cells.

According to still another aspect of an embodiment of the present invention, there is provided a method for manufacturing a charge trap type non-volatile memory device having memory cells formed on a silicon substrate at a predetermined interval via an element isolation trench along a first direction in which word lines extend, comprising: stacking at least a tunnel insulating film material, a charge film material, an etching protective film material, and a buffer film material on the silicon substrate; forming the element isolation trenches that extend from the buffer film material to the silicon substrate by etching the buffer film material, the etching protective film material, the charge film material, the tunnel insulating film material, and the silicon substrate; forming each of the memory cells as a memory cell having a tunnel insulating film, a charge film, and an etching protective film and a buffer film that cover the charge film; depositing each of the element isolation insulating films in each of the element isolation trenches; etching each of the element isolation insulating films so that an upper surface of each of the element isolation insulating films comes near to an interface between each of the buffer films and each of the etching protective films; removing each of the buffer films and each of the etching protective films; and etching each of the element isolation insulating films so that an upper portion of a side wall of each of the element isolation insulating films contacts with a side wall of each of the charge films.

According to a further aspect of an embodiment of the present invention, there is provided a method for manufacturing a charge trap type non-volatile memory device having: a memory cell array section comprising memory cells formed on a silicon substrate at a predetermined interval via an element isolation trench along a first direction in which word lines extend, and a select gate section comprising select gate transistors formed on the silicon substrate at a predetermined interval via a select gate transistor isolation trench along the first direction, comprising: stacking at least a tunnel insulating film material, a charge film material, an etching protective film material, and a buffer film material on the silicon substrate in both of the memory cell array section and the select gate section; etching the buffer film material, the etching protective film material, the charge film material, the tunnel insulating film material, and the silicon substrate in both of the memory cell array section and the select gate section so that: forming the element isolation trenches of the memory cell array section extend from the buffer film material to the silicon substrate, and forming each of the memory cells having a tunnel insulating film, a charge film, and an etching protective film and a buffer film that cover the charge film; and forming the select gate transistor isolation trenches of the select gate section extend from the buffer film material to the silicon substrate, and forming each of the select gate transistors having a tunnel insulating film, a charge film, and an etching protective film and a buffer film that cover the charge film; depositing an insulating film material in the element isolation trenches of the memory cell array section and in the select gate transistor isolation trenches of the select gate section, and thereby forming the element isolation insulating films of the memory cell array section and the select gate transistor isolation insulating films of the select gate section; etching each of the element isolation insulating films and each of the select gate transistor isolation insulating films so that an upper surface of each of the element isolation insulating films in the memory cell array section and an upper surface of each of the select gate transistor isolation insulating films in the select gate section come near to an interface between the buffer film and the etching protective film; removing the buffer films in both of the memory cell array section and the select gate section; removing the charge films and the etching protective films in the select gate section; removing the etching protective films in the memory cell array section and etching each of the element isolation insulating films so that an upper portion of a side wall of each of the element isolation insulating films in the memory cell array section contacts with a side wall of each of the charge films; and removing the tunnel insulating films in the select gate section.

BRIEF DESCRIPTION OF THE DRAWINGS

FIG. 1-1 is a schematic sectional view showing part of a memory cell array section of a charge trap type non-volatile memory device in the first embodiment of the present invention;

FIG. 1-2 is a schematic process sectional view (part 1) to explain the manufacturing process of the first embodiment of the present invention;

FIG. 1-3 is a schematic process sectional view (part 2) to explain the manufacturing process of the first embodiment of the present invention;

FIG. 1-4 is a schematic process sectional view (part 3) to explain the manufacturing process of the first embodiment of the present invention;

FIG. 1-5 is a schematic process sectional view (part 4) to explain the manufacturing process of the first embodiment of the present invention;

FIG. 1-6 is a schematic process sectional view (part 5) to explain the manufacturing process of the first embodiment of the present invention;

FIG. 1-7 is a schematic process sectional view (part 6) to explain the manufacturing process of the first embodiment of the present invention;

FIG. 1-8 is a schematic process sectional view (part 7) to explain the manufacturing process of the first embodiment of the present invention;

FIG. 1-9 is a schematic process sectional view (part 8) to explain the manufacturing process of the first embodiment of the present invention;

FIG. 1-10 is a schematic process sectional view (part 9) to explain the manufacturing process of the first embodiment of the present invention;

FIG. 1-11 is a schematic process sectional view (part 10) to explain the manufacturing process of the first embodiment of the present invention;

FIG. 1-12 is a schematic process sectional view (part 11) to explain the manufacturing process of the first embodiment of the present invention;

FIG. 1-13 is a schematic process sectional view (part 12) to explain the manufacturing process of the first embodiment of the present invention;

FIG. 1-14 is a schematic process sectional view (part 13) to explain the manufacturing process of the first embodiment of the present invention;

FIG. 1-15 is a schematic process sectional view (part 14) to explain the manufacturing process of the first embodiment of the present invention;

FIG. 1-16 is a schematic sectional view showing part of a memory cell array section of a charge trap type non-volatile memory device in the second modification of the first embodiment of the present invention;

FIG. 2-1 is a schematic sectional view showing part of a memory cell array section and part of a select gate section of a charge trap type non-volatile memory device in the second embodiment of the present invention;

FIG. 2-2 is a schematic process sectional view (part 1) to explain the manufacturing process of the second embodiment of the present invention;

FIG. 2-3 is a schematic process sectional view (part 2) to explain the manufacturing process of the second embodiment of the present invention;

FIG. 2-4 is a schematic process sectional view (part 3) to explain the manufacturing process of the first embodiment of the present invention;

FIG. 2-5 is a schematic process sectional view (part 4) to explain the manufacturing process of the second embodiment of the present invention;

FIG. 2-6 is a schematic process sectional view (part 5) to explain the manufacturing process of the second embodiment of the present invention;

FIG. 2-7 is a schematic process sectional view (part 6) to explain the manufacturing process of the second embodiment of the present invention;

FIG. 2-8 is a schematic process sectional view (part 7) to explain the manufacturing process of the second embodiment of the present invention;

FIG. 2-9 is a schematic process sectional view (part 8) to explain the manufacturing process of the second embodiment of the present invention;

FIG. 2-10 is a schematic process sectional view (part 9) to explain the manufacturing process of the second embodiment of the present invention;

FIG. 2-11 is a schematic process sectional view (part 10) to explain the manufacturing process of the second embodiment of the present invention;

FIG. 2-12 is a schematic process sectional view (part 11) to explain the manufacturing process of the second embodiment of the present invention;

FIG. 2-13 is a schematic process sectional view (part 12) to explain the manufacturing process of the second embodiment of the present invention;

FIG. 2-14 is a schematic process sectional view (part 13) to explain the manufacturing process of the second embodiment of the present invention;

FIG. 2-15 is a schematic process sectional view (part 14) to explain the manufacturing process of the second embodiment of the present invention;

FIG. 2-16 is a schematic process sectional view (part 15) to explain the manufacturing process of the second embodiment of the present invention;

FIG. 2-17 is a schematic process sectional view (part 16) to explain the manufacturing process of the second embodiment of the present invention;

FIG. 2-18 is a schematic process sectional view (part 17) to explain the manufacturing process of the second embodiment of the present invention;

FIG. 3 is a schematic top view showing part of charge trap type non-volatile memory devices in the first and second embodiments of the present invention; and FIG. 4 is a reference view showing an example of a charge trap type non-volatile memory device that the present inventors know.

DESCRIPTION OF THE EMBODIMENTS

Embodiments of the present invention will be described below with reference to the accompanying drawings.

Figures 1, 2, 3:
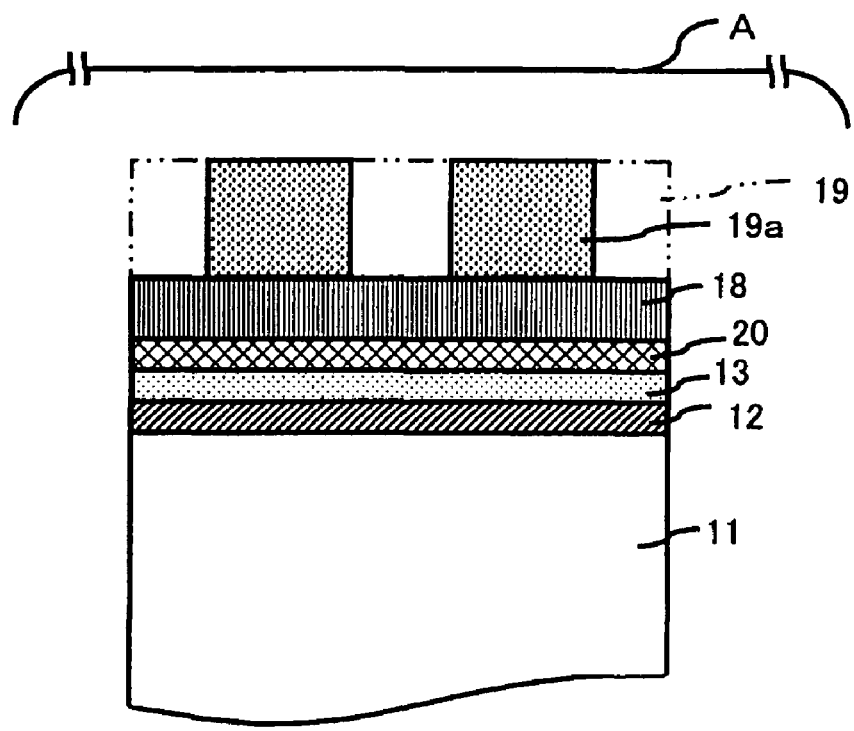
Figures 1, 2, 3, 4:
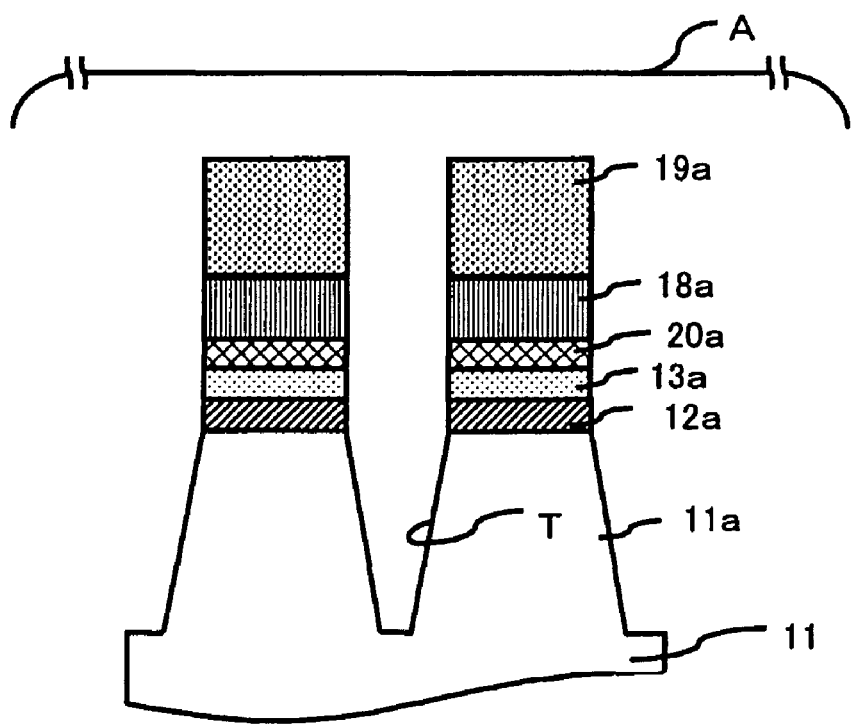
Figures 1, 2, 3, 4, 5:
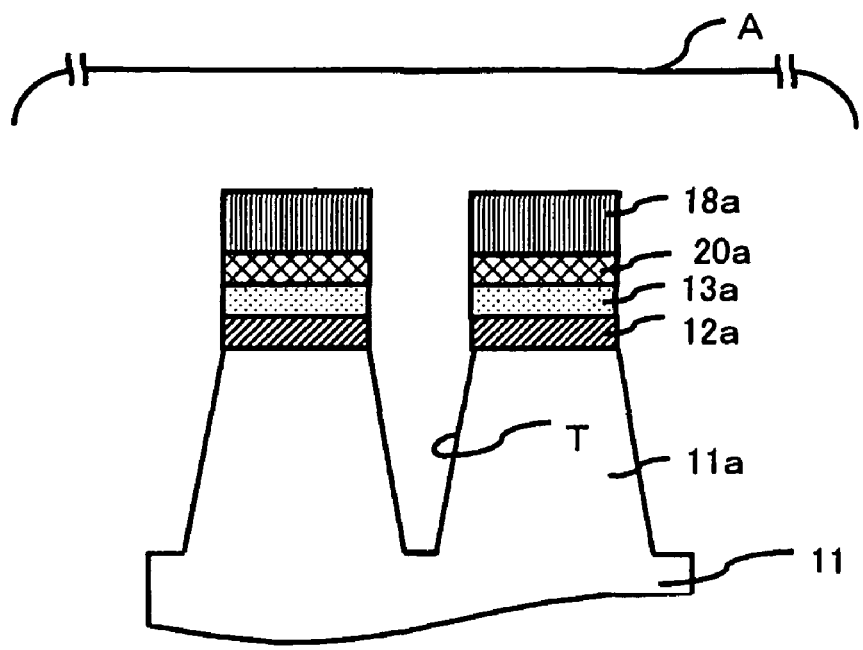
Figures 1, 2, 3, 4, 5, 6:
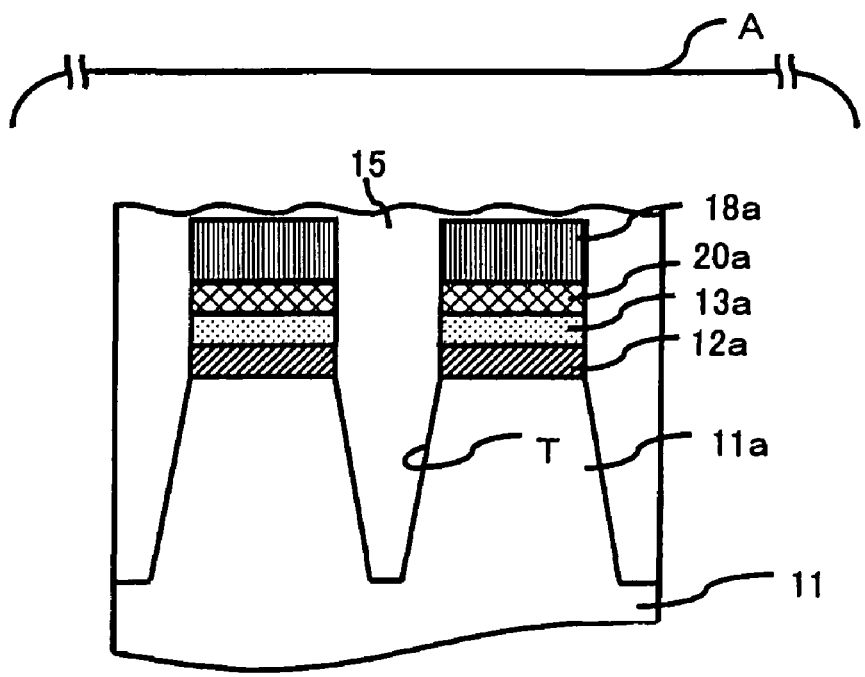
Figures 1, 2, 3, 4, 5, 6, 7:
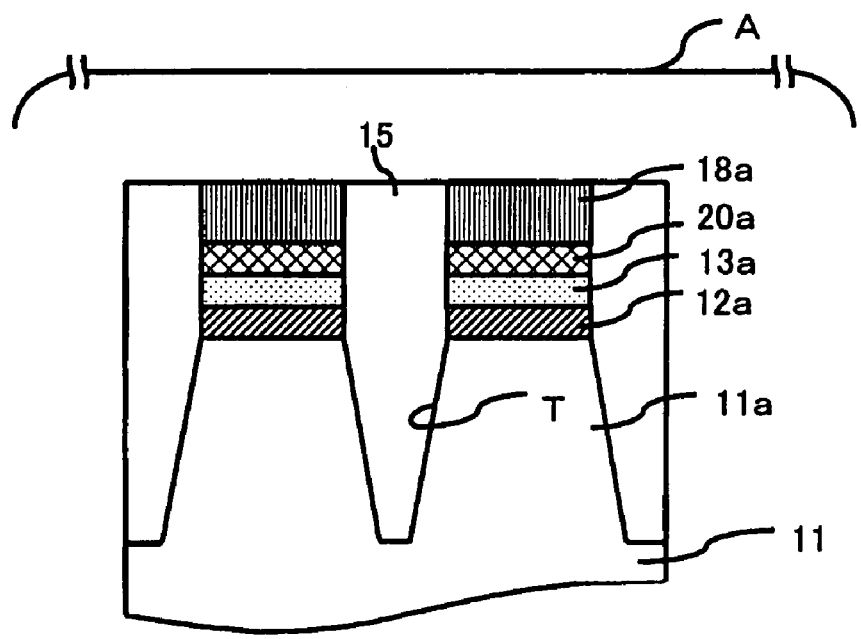
Figures 1, 2, 3, 4, 5, 6, 7, 8:
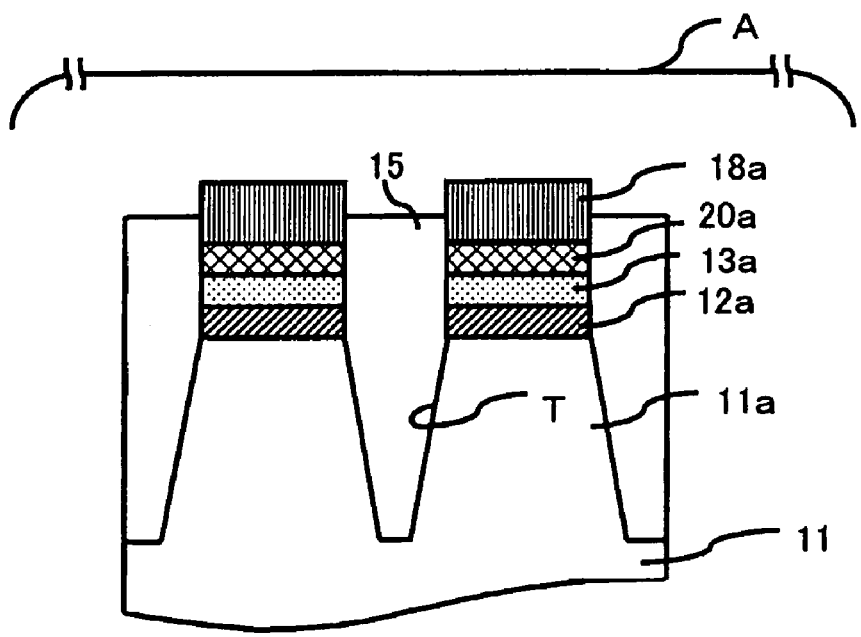
Figures 1, 2, 3, 4, 5, 6, 7, 8, 9:
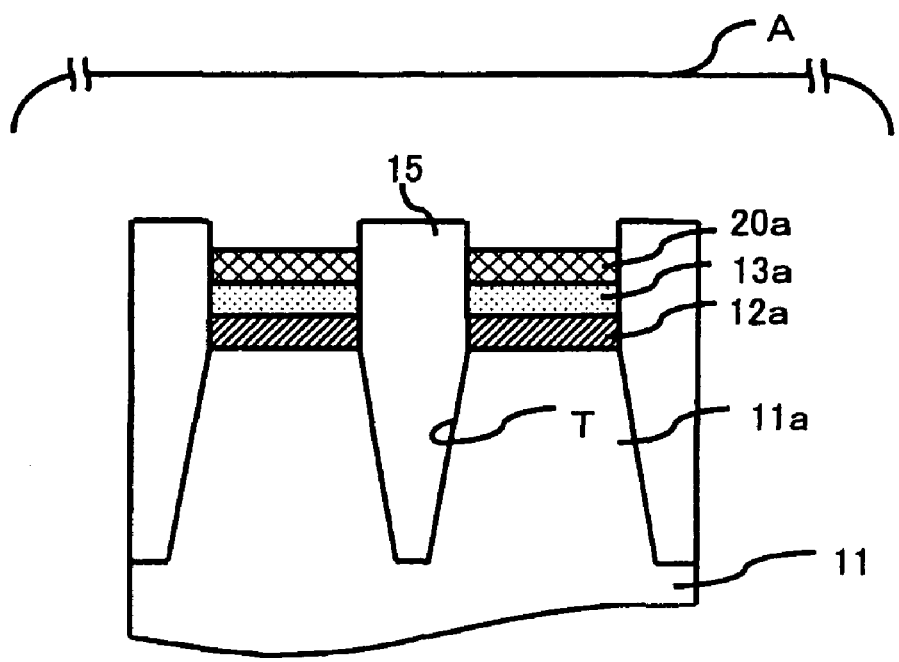
Figures 1, 2, 3, 4, 5, 6, 7, 8, 9, 10:
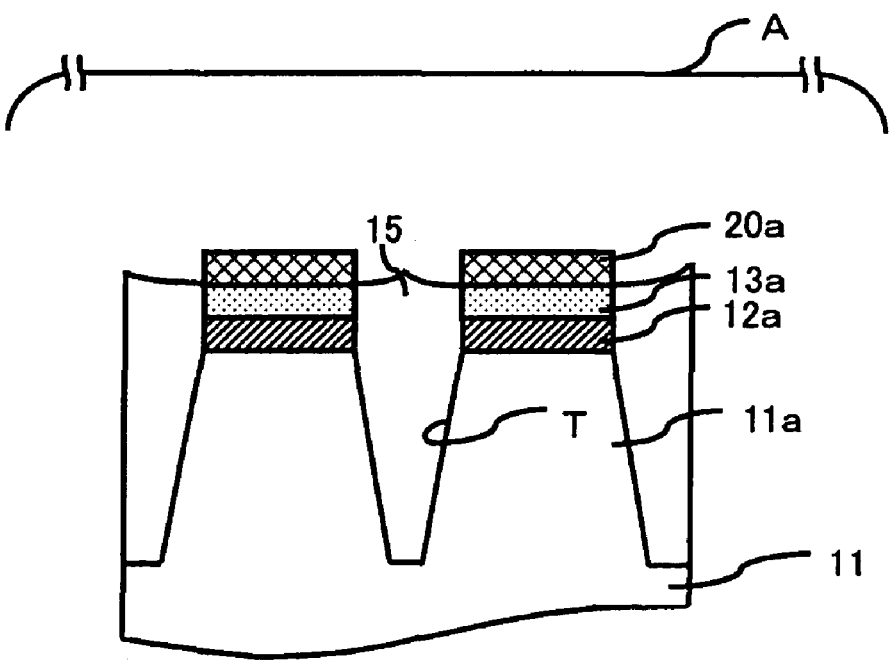
Figures 1, 2, 3, 4, 5, 6, 7, 8, 9, 10, 11:
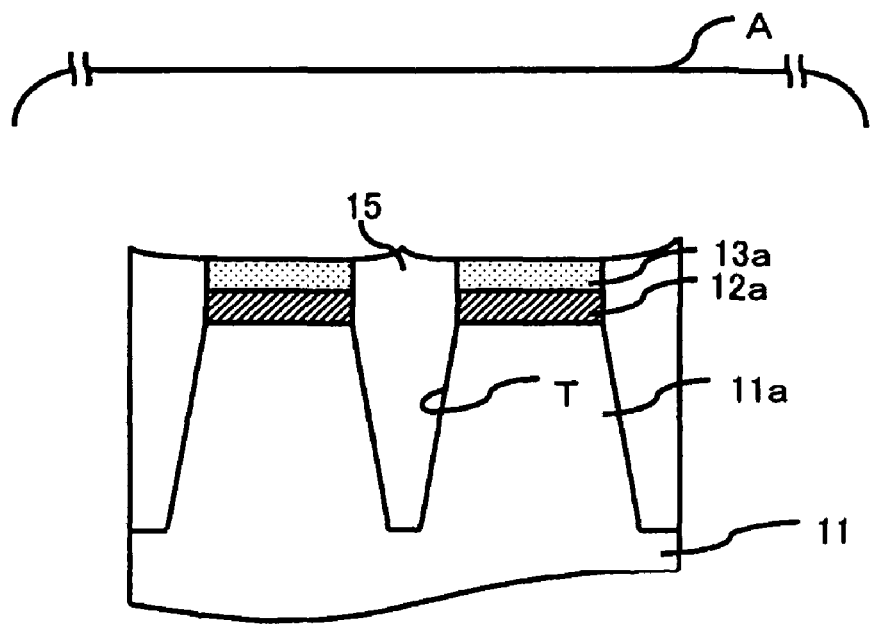
Figures 1, 2, 3, 4, 5, 6, 7, 8, 9, 10, 11, 12:
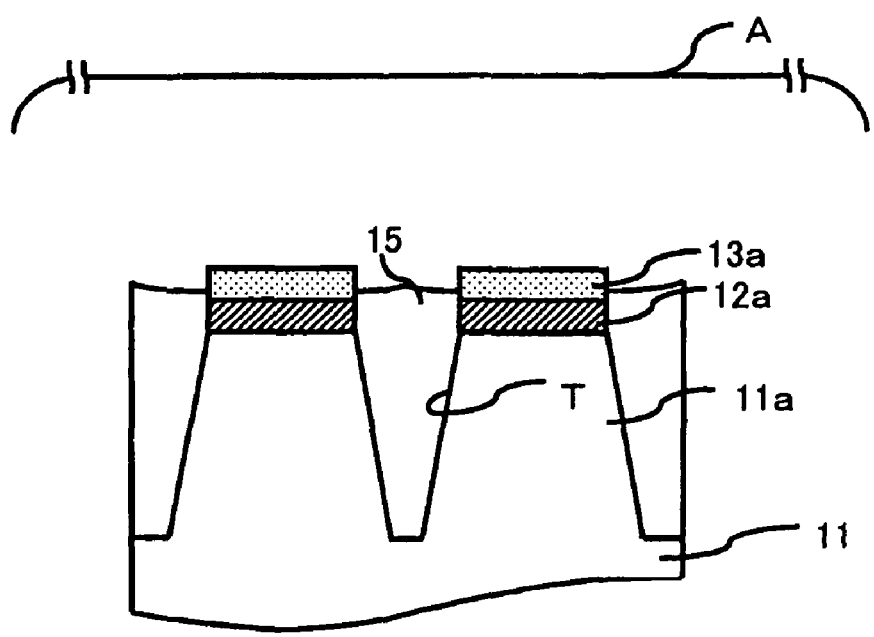
Figures 1, 2, 3, 4, 5, 6, 7, 8, 9, 10, 11, 12, 13:
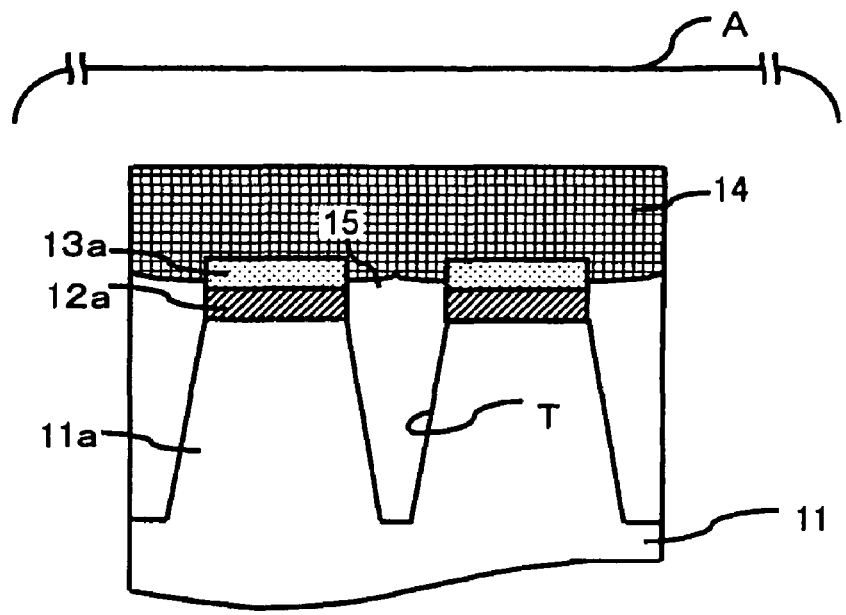
Figures 1, 2, 3, 4, 5, 6, 7, 8, 9, 10, 11, 12, 13, 14:
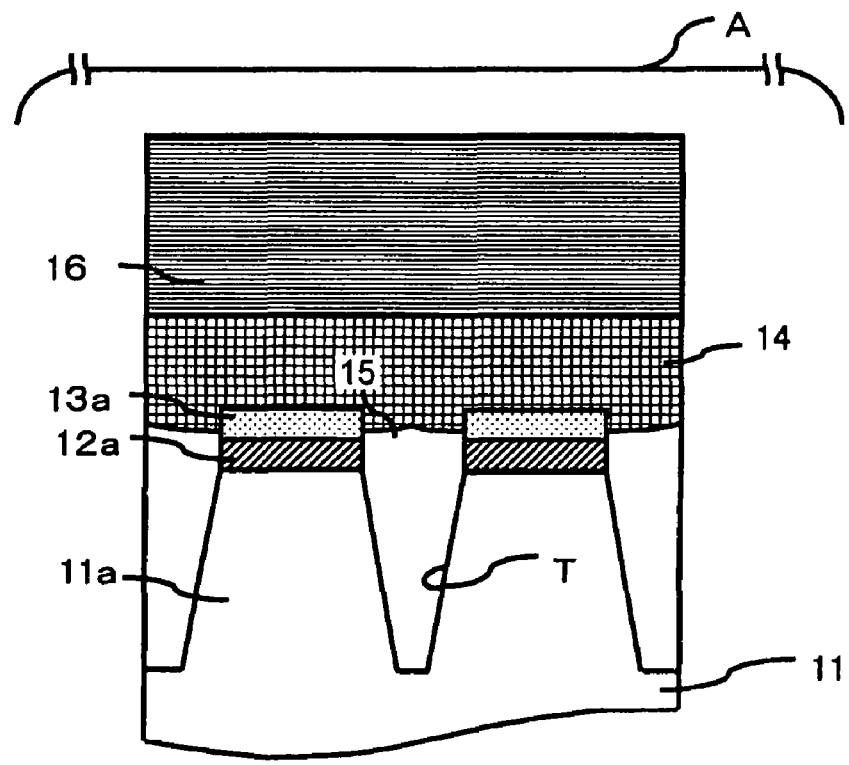
Figures 1, 2, 3, 4, 5, 6, 7, 8, 9, 10, 11, 12, 13, 14, 15:
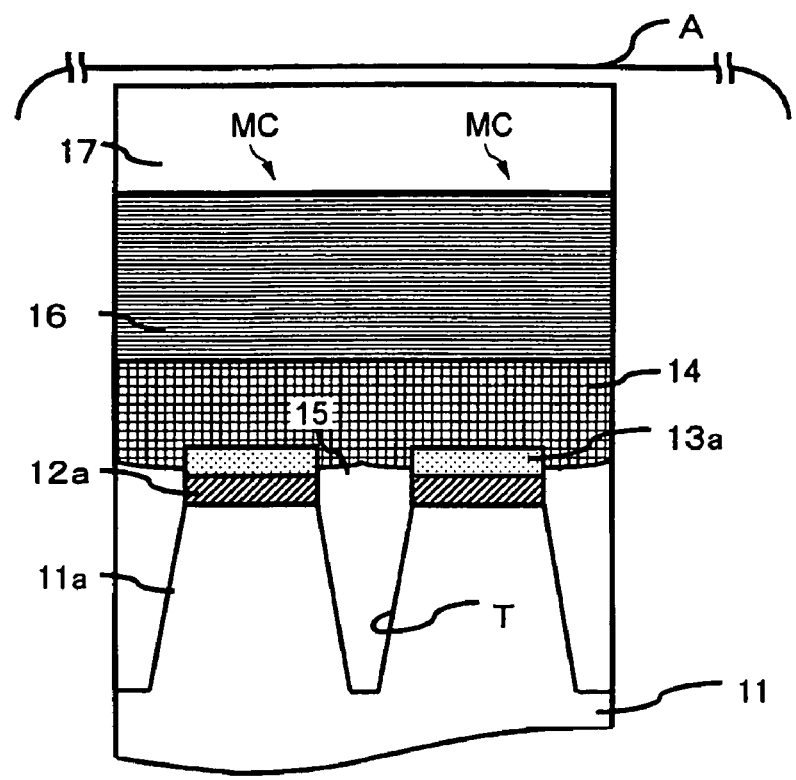
Figures 1, 2, 3, 4, 5, 6, 7, 8, 9, 10, 11, 12, 13, 14, 15, 16:
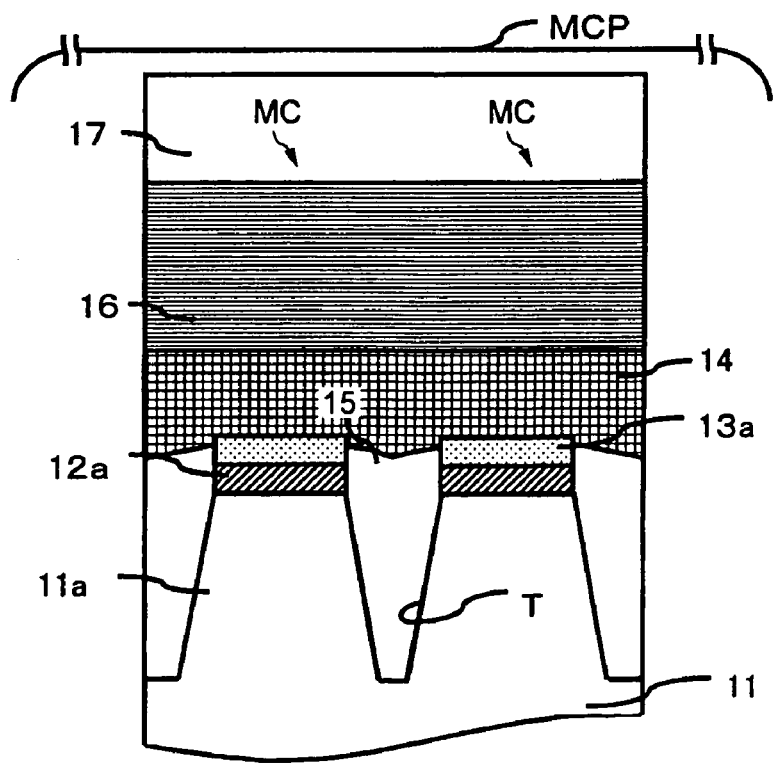
Figures 1, 2:
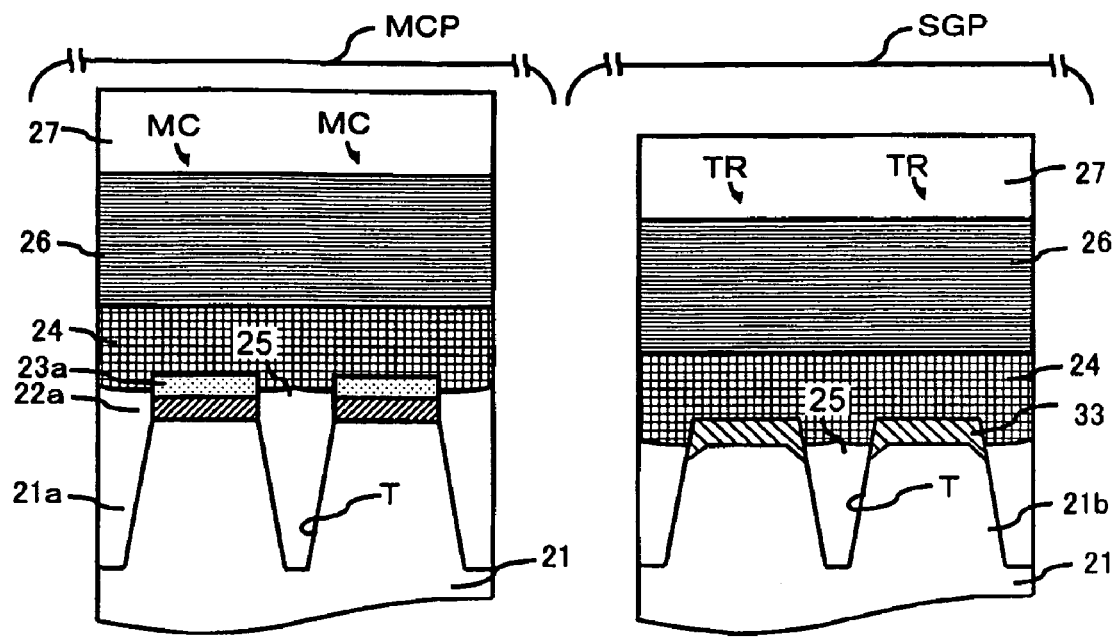
Figure 2:
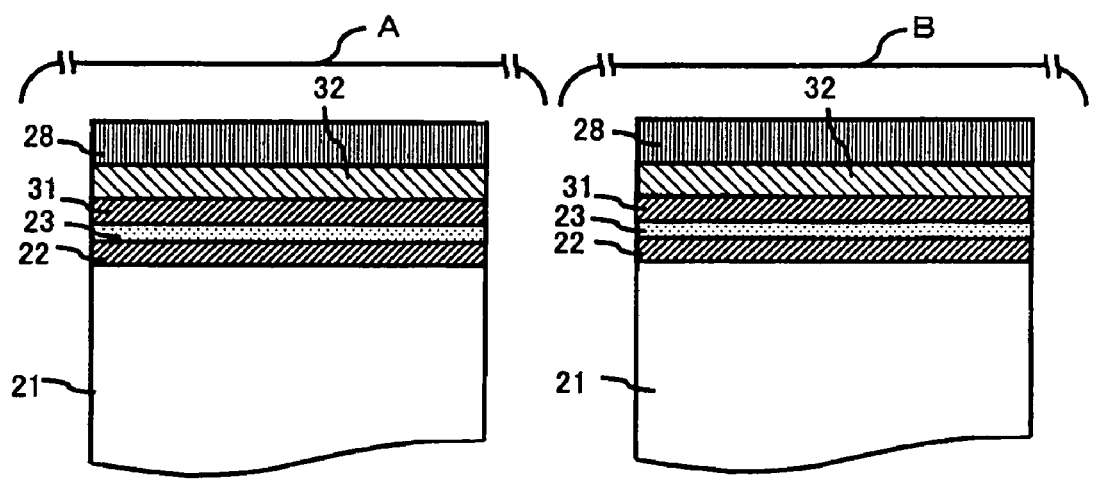
Figures 2, 3:
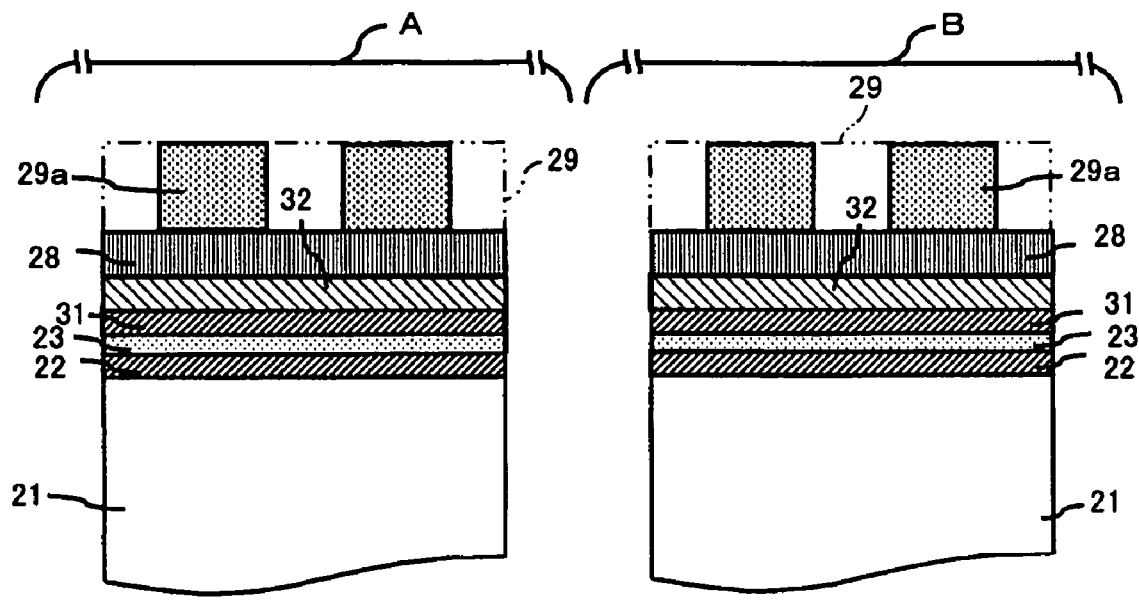
Figures 2, 3, 4:
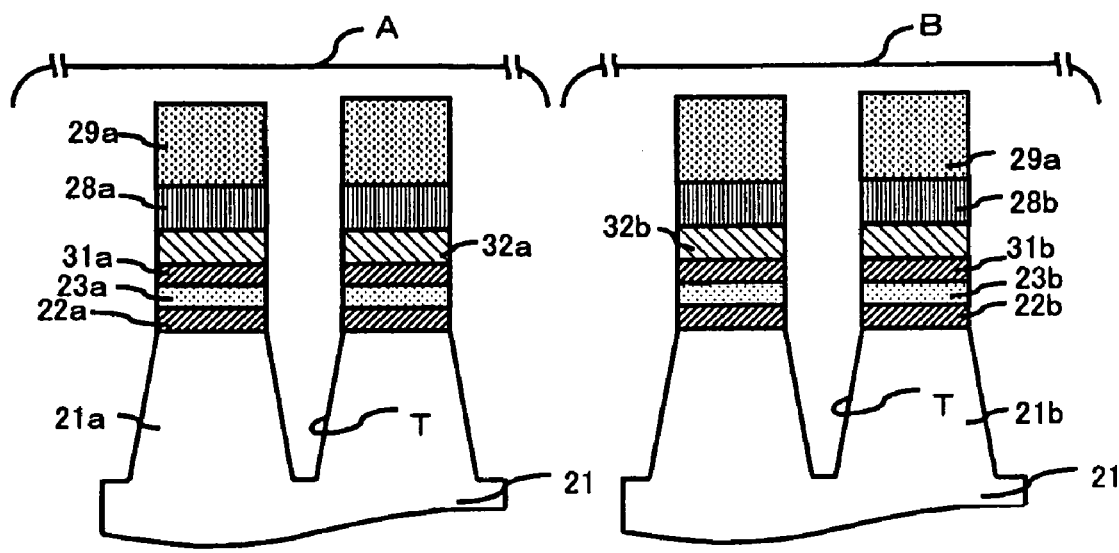
Figures 2, 3, 4, 5:
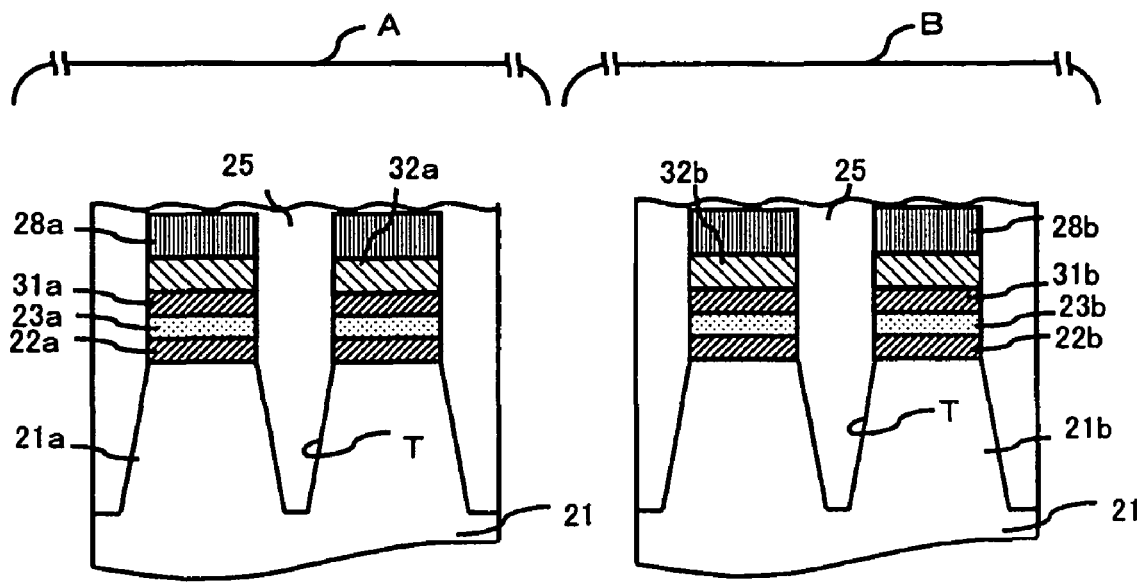
Figures 2, 3, 4, 5, 6:
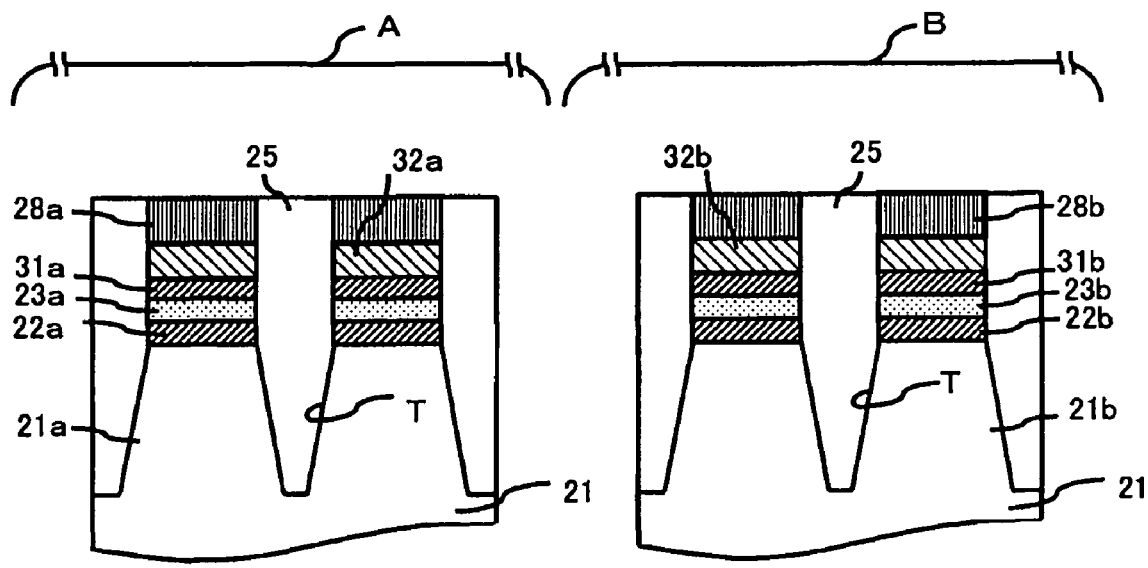
Figures 2, 3, 4, 5, 6, 7:
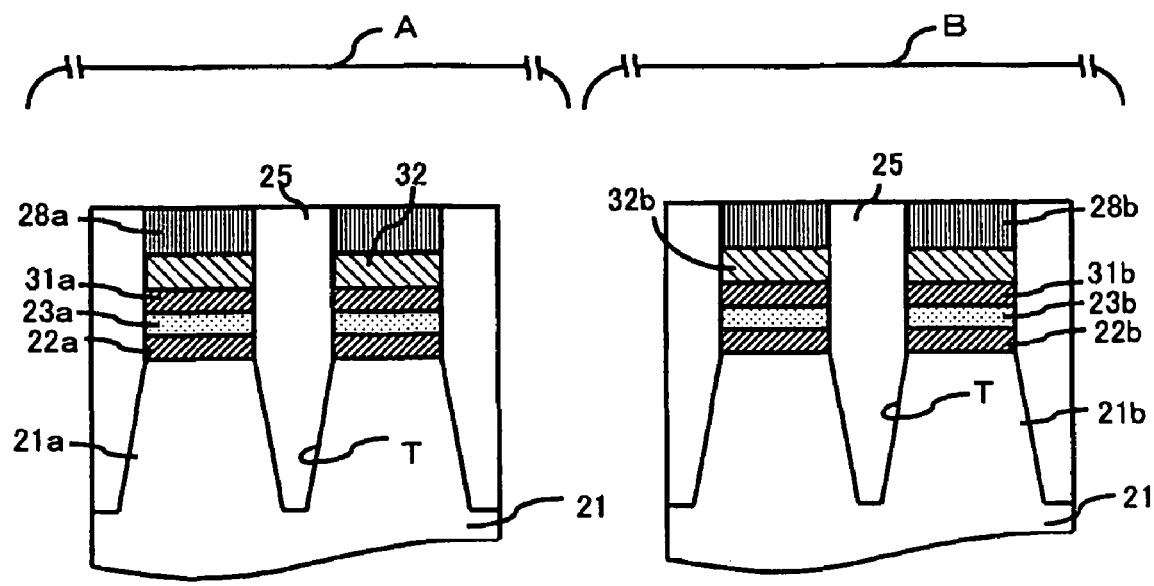
Figures 2, 3, 4, 5, 6, 7, 8:
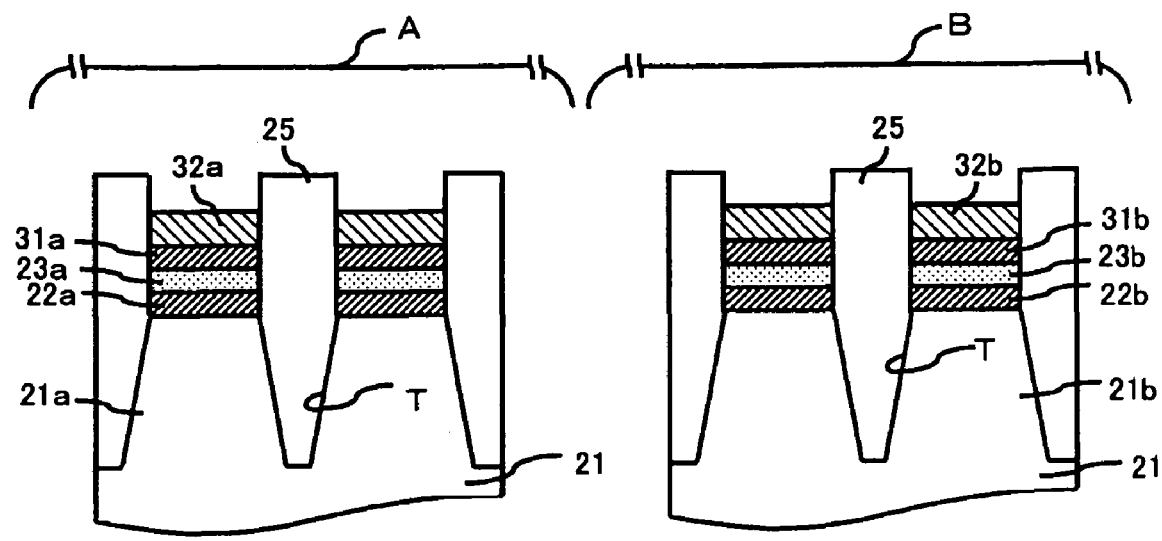
Figures 2, 3, 4, 5, 6, 7, 8, 9:
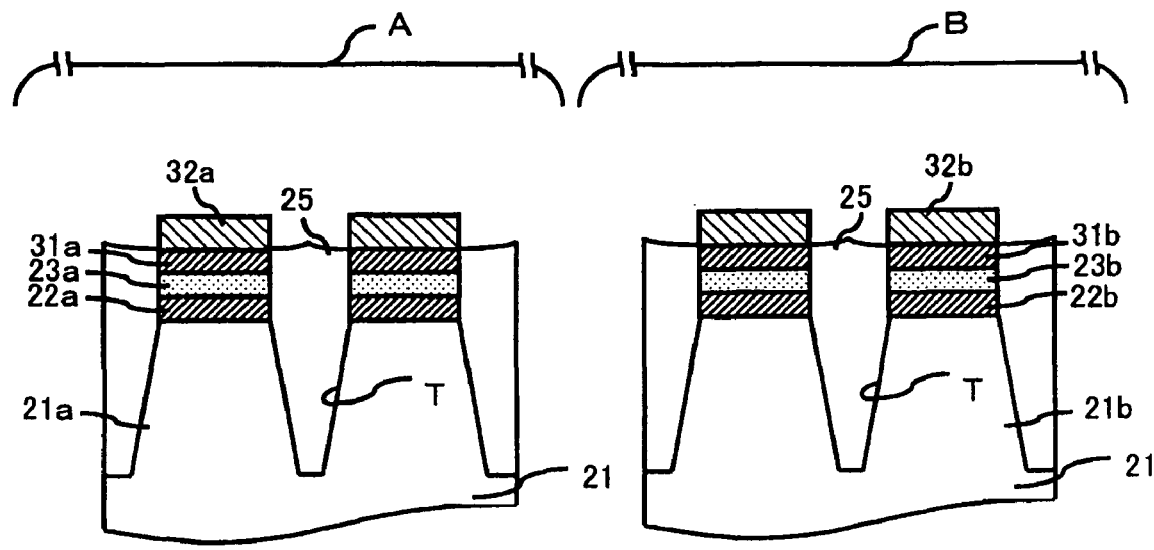
Figures 2, 3, 4, 5, 6, 7, 8, 9, 10:
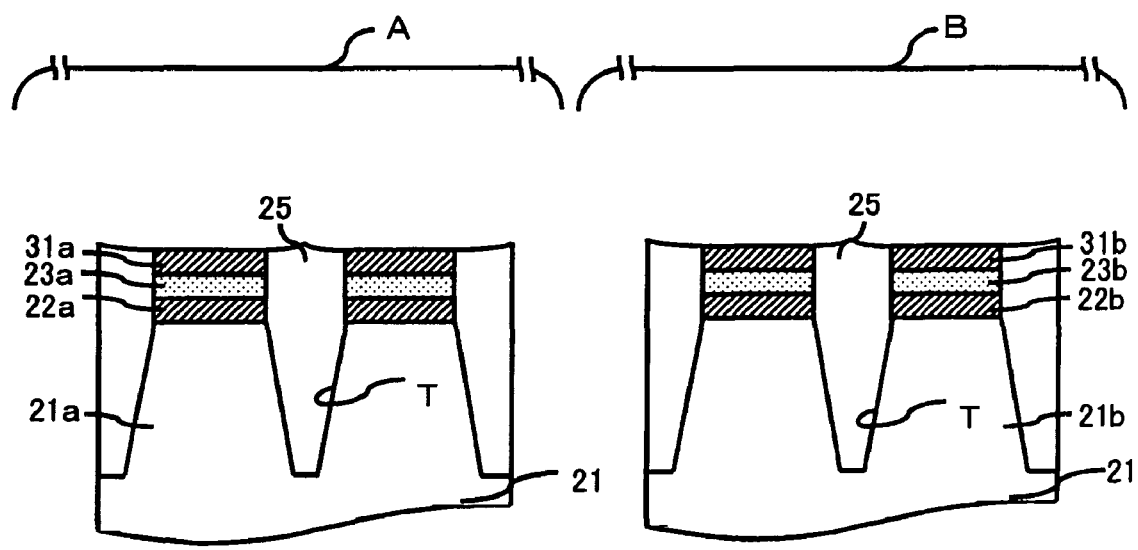
Figures 2, 3, 4, 5, 6, 7, 8, 9, 10, 11:
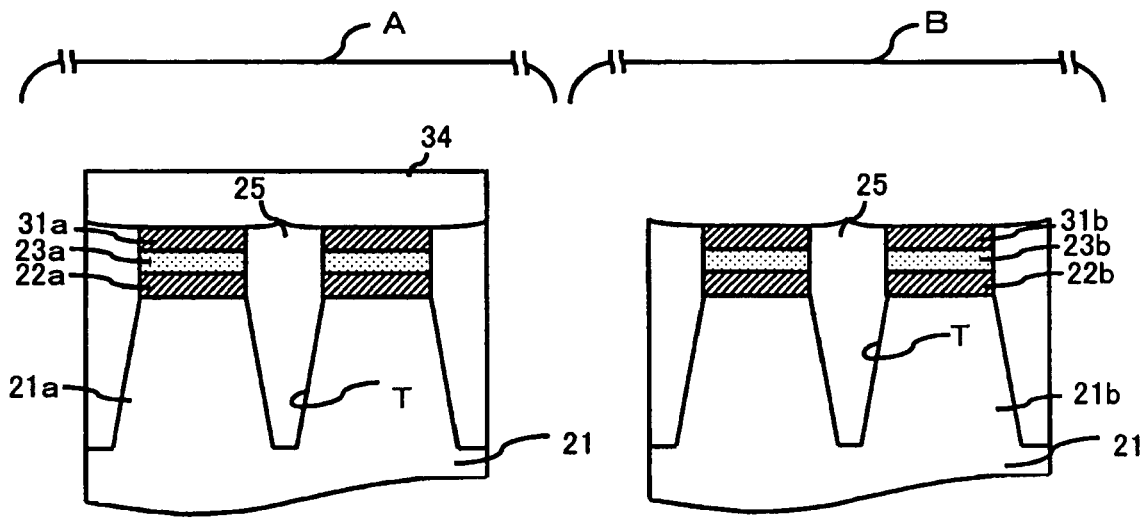
Figures 2, 3, 4, 5, 6, 7, 8, 9, 10, 11, 12:
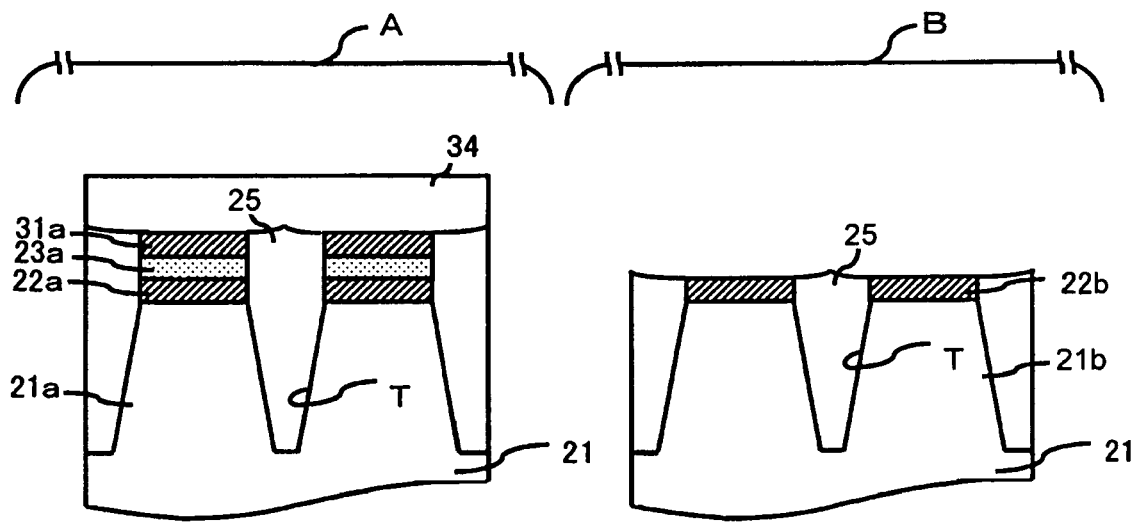
Figures 2, 3, 4, 5, 6, 7, 8, 9, 10, 11, 12, 13:
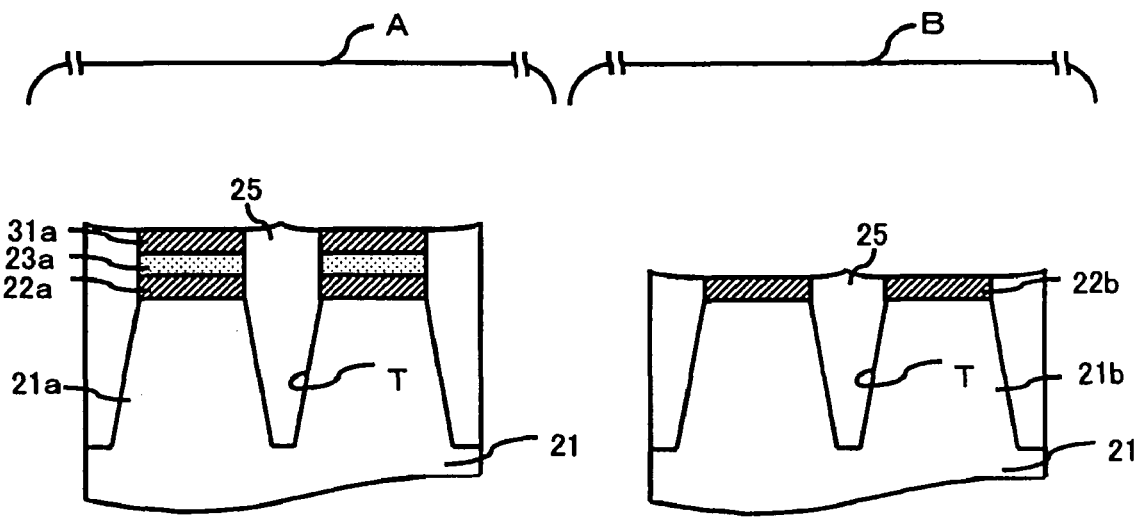
Figures 2, 3, 4, 5, 6, 7, 8, 9, 10, 11, 12, 13, 14:
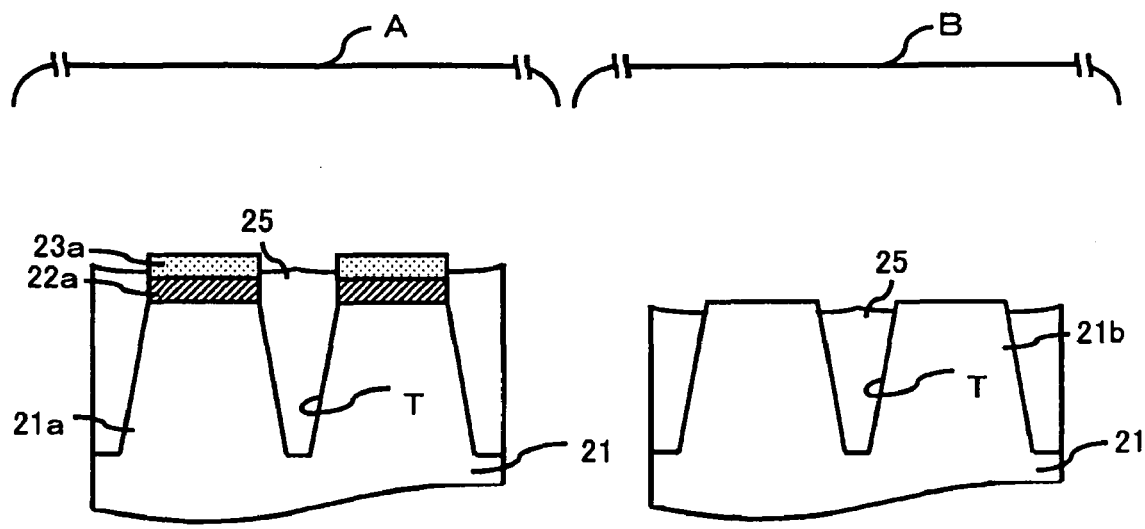
Figures 2, 3, 4, 5, 6, 7, 8, 9, 10, 11, 12, 13, 14, 15:
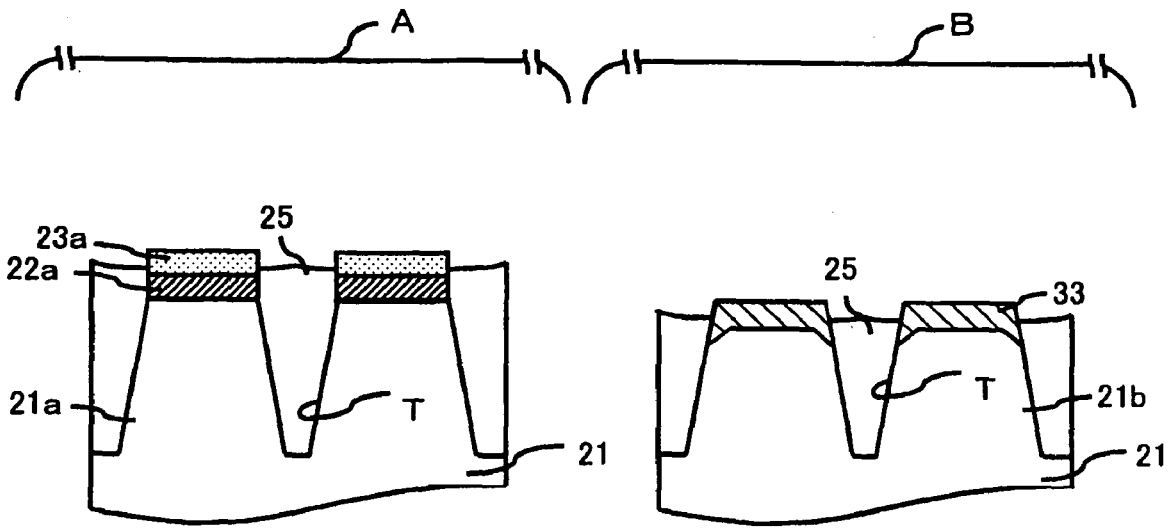
Figures 2, 3, 4, 5, 6, 7, 8, 9, 10, 11, 12, 13, 14, 15, 16:
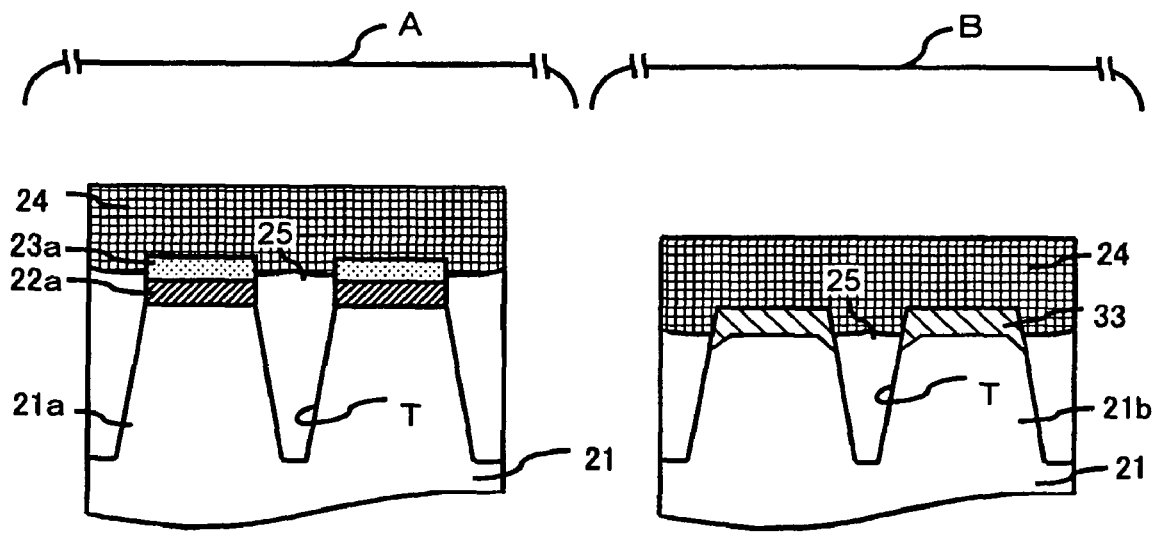
Figures 2, 3, 4, 5, 6, 7, 8, 9, 10, 11, 12, 13, 14, 15, 16, 17:
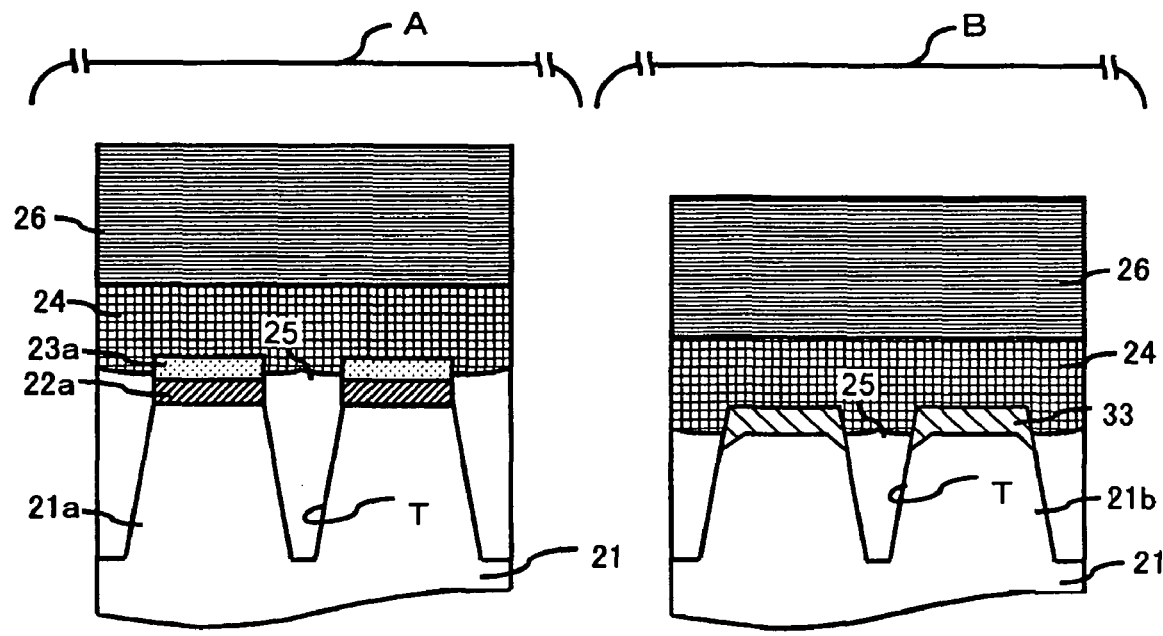
Figures 2, 3, 4, 5, 6, 7, 8, 9, 10, 11, 12, 13, 14, 15, 16, 17, 18:
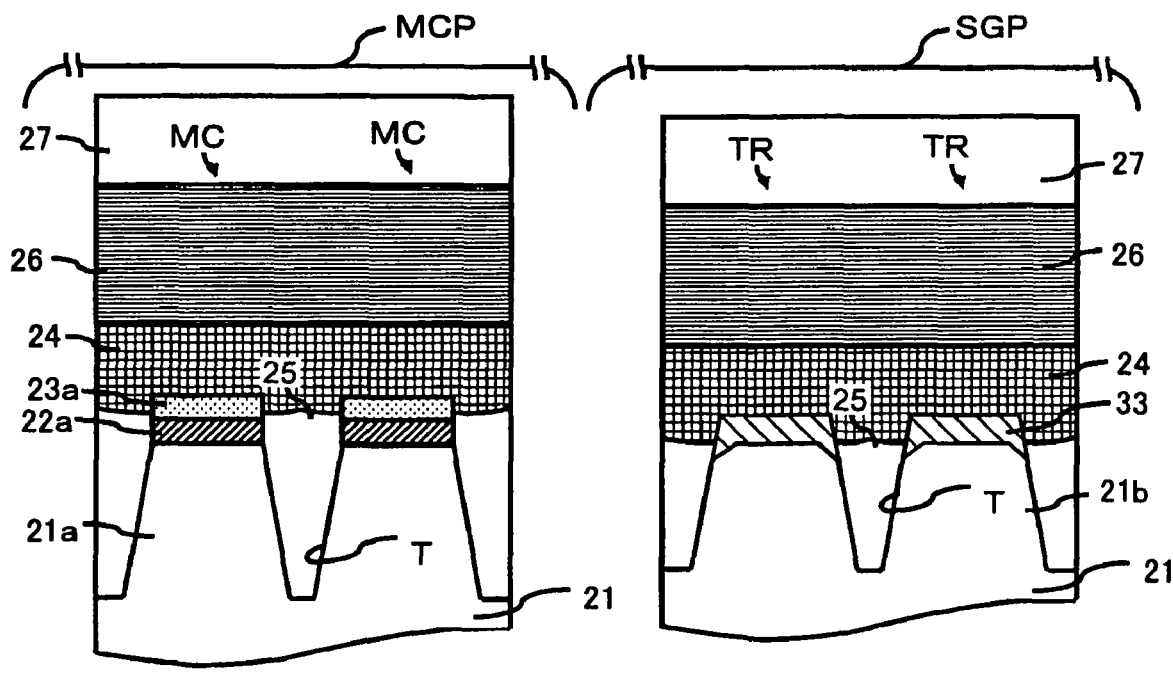
Figure 3:
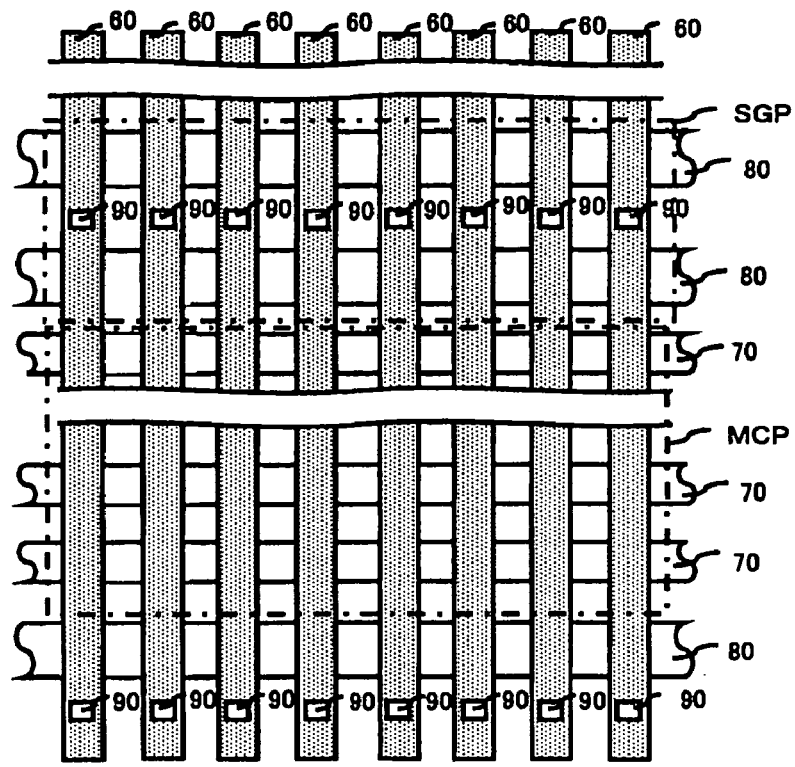
Figure 4:
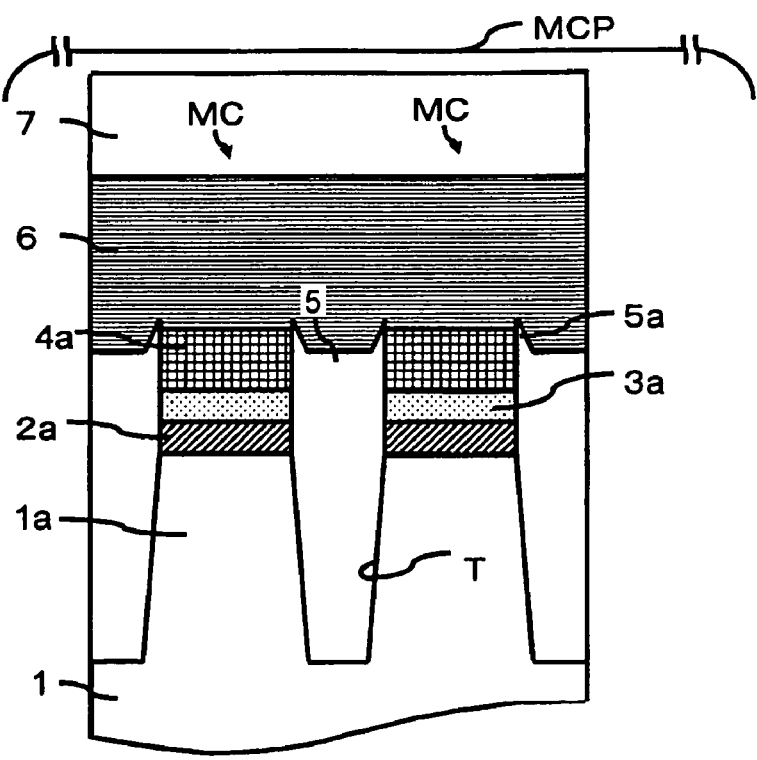

FIG. 4 is a reference view showing part of a memory cell array section MCP in a charge trap type non-volatile memory device to make a comparison with the present invention, and shows a section obtained by cutting the memory cell array section MCP along a word line direction.

As shown in FIG. 4, this charge trap type non-volatile memory device has a plurality of memory cell MCs along the word line direction in the memory cell array section MCP. Each of the memory cells MCs has a tunnel insulating film (a silicon oxide film) 2a formed on a silicon substrate 1a, a charge film (a silicon nitride film) 3a formed on the tunnel insulating film 2a, a block film (an aluminum oxide film) 4a formed on the charge film, a common control electrode film (a phosphorus-doped amorphous silicon film) 6 formed on the block film, and a cover film (a silicon nitride film) 7 formed on the common control electrode film.

A trench T is formed between the pair of memory cells MCs adjacent to each other along the word line direction, and an element isolation insulating film (a silicon oxide film) 5 is buried in the trench T.

Furthermore, the common control electrode film (a phosphorus-doped amorphous silicon film) 6 is stacked so that the common control electrode film covers each of the element isolation insulating films 5 and each of the block films 4a along the word line direction, and the cover film 7 is stacked on this common control electrode film 6.

When such a structure is used as a memory cell, it is desirable that the height of an upper surface of the element isolation insulating film be lowered as far as possible in order to reduce the effect of the mutual interference of the adjacent memory cells. However, if the upper surface of the element isolation insulating film 5 in the trench T lowers due to variations in etching, this is accompanied by the entry of the common control electrode film 6 into the trench T. As a result, the common control electrode film 6 and the charge film 3a come closer to each other, leading to a break of insulation or a contact with each other, and there is a fear of a short circuit between the two.

Therefore, it is desirable that a charge trap type non-volatile memory device be of a construction in which such a short circuit does not occur.

When there are remaining portions 5a of the insulating film as shown in FIG. 4, electric field losses occur. Due to the electric field losses, an electric field applied across the common control electrode film and the silicon substrate in a memory cell is not applied to the whole charge film body as a uniform voltage. As a result, it becomes difficult to obtain a memory cell having good writing and reading characteristics.

By conducting such unique analyses, the present inventors obtained in a manner unique to themselves the knowledge that the above-described drawbacks can be avoided by positioning the height of the upper surface of the element isolation insulating film in a predetermined position with good accuracy.

The present invention has been made on the basis of such knowledge unique to the invention.

Embodiments of the present invention will be described below.

First Embodiment

First, a description will be given of the construction of a charge trap type non-volatile memory device in the first embodiment.

FIG. 3 shows a schematic top view of part of a charge trap type non-volatile memory device in the first embodiment.

Incidentally, also a top view of a charge trap type non-volatile memory device in the second embodiment, which will be described later, is made in the same manner as FIG. 3.

As shown in FIG. 3, in the charge trap type non-volatile memory device in the first embodiment, a plurality of bit lines 60 are formed along a vertical direction of the paper (a second direction). Furthermore, the plurality of bit lines 60 are arranged at a constant interval along a transverse direction of the paper (a first direction), and are parallel to each other. A plurality of word lines (control electrode films) 70 and a plurality of select gate lines 80 are formed so as to be orthogonal to the plurality of bit lines 60 as viewed from the plane.

A plurality of memory cell MCs are formed in a plurality of areas where each of the bit lines 60 and each of the word lines 70, which are shown in FIG. 3, three-dimensionally intersect each other. In other words, the plurality of memory cells are arranged in a matrix form in the memory cell array section MCP of the charge trap type non-volatile memory device. The memory cell MCs, which are each in a pair adjacent to each other along the first direction in which the word lines extend, are arranged at a constant interval via an element isolation insulating trench. The memory cell MCs, which are each in a pair adjacent to each other along the second direction orthogonal to the first direction, are connected via a common source/drain region, whereby the plurality of memory cell MCs are sequentially connected along the second direction. Furthermore, an element isolation insulating films is buried in the element isolation trench, and the element isolation insulating films, which are each in a pair adjacent to each other along the second direction, are sequentially connected to each other; hence the element isolation insulating films are formed as strip-shape films.

A select gate section SGP arranged at least one side of the memory cell array section MCP is provided with a plurality of select transistors TRs. The plurality of select transistors TRs are arranged in a plurality of areas where the plurality of bit lines 60 and the plurality of select gate lines 80 three-dimensionally intersect each other. The select gate transistors TRs, which are each in a pair adjacent to each other along the first direction, are arranged at a constant interval via a select gate transistor insulation trench. The plurality of select transistors TRs are each connected by a contact 90 to the corresponding bit lines 60. Each of the select gate transistors TRs is connected by a common source/drain region to the memory cell MCs adjacent along the second direction. Furthermore, a select gate transistor isolation insulating film is buried in the select gate transistor isolation trench present between the select gate transistors, which are each in a pair adjacent to each other along the first direction. The select gate transistor isolation insulating film is connected to the adjacent element insulation insulating film.

The relationship between the memory cell array section MCP and the select gate section SGP in the charge trap type non-volatile memory device in the first embodiment is described as in the foregoing with reference to FIG. 3.

Incidentally, the bit lines 60 are omitted in FIG. 1-1 to FIG. 1-16.

FIG. 1-1 shows a section of part of a memory cell array section MCP in the charge trap type non-volatile memory device of the first embodiment, which is obtained by being cut along the word line direction.

As shown in FIG. 1-1, the charge trap type non-volatile memory device in the first embodiment has in the memory cell array section MCP a plurality of memory cells MCs along the word line direction.

Each of the memory cells MCs has a tunnel insulating film (a silicon oxide film) 12a formed on a silicon substrate 11a, a charge film (a silicon nitride film) 13a formed on the tunnel insulating film 12a, a common block film (an aluminum oxide film) 14 formed on the charge film 13a, a common control electrode film (a phosphorus-doped amorphous silicon film) 16 formed on the common block film 14, and a cover film (a silicon nitride film) 17 formed on the common control electrode film 16.

A trench T for element isolation is formed between the pair of memory cell MCs adjacent to each other along the word line direction, and an element isolation insulating film (a silicon oxide film) 15 is buried in the trench T. The element isolation insulating film 15 is provided in such a condition that an upper portion of a side wall thereof contacts with a side wall of the charge film 13a in the memory cell MC.

Furthermore, the common block film 14, which is one continuous layer, is stacked so as to cover an upper surface of the element isolation insulating films 15 and an upper surface and part of a side wall of the charge film 13a, and thereupon the common control electrode film 16 and the cover film 17 are stacked.

In the charge trap type non-volatile memory device in the embodiment of the present invention, the height of the central portion of the upper surface of the element isolation insulating film 15 in the trench T is smaller than the height of the upper surface of the charge film 13a at least in the memory cell MC and, therefore, the mutual interference of the memory cells can be reduced. Furthermore, the common block film 14 is stacked as one continuous layer after the formation of the STI structure, whereby in the interior of the trench T the element isolation insulating film 15 and the common control electrode film 16 are partitioned by the common block film 14. As a result, it is possible to avoid the occurrence of a short circuit between the control electrode film 16 and the charge film 13a. Furthermore, because there is no remaining portion of the insulating film that might protrude from the trench T in the upper end portion of the element isolation insulating film 15 (see the numeral 5a of FIG. 4), electric filed losses do not occur and this makes it possible to ensure good memory cell characteristics.

Next, the manufacturing process of a charge trap type non-volatile memory device of the above-described structure will be described.

Next, the manufacturing process of the charge trap type non-volatile memory device of the first embodiment will be described in order of steps with reference to FIG. 1-2 to FIG. 1-14.

FIG. 1-2 to FIG. 1-15 show sections of part of a region A of the charge trap type non-volatile memory device in this embodiment where the memory cell array section is to be formed, which are obtained by being cut along the word line direction showing the transition of sections obtained in the processes. The region A where a memory cell array section is to be formed becomes the memory cell array section MCP after the completion of the charge trap type non-volatile memory device of this embodiment.

First, upon the silicon substrate 11, there are sequentially formed a tunnel insulating film material (a silicon oxide film material) 12, a charge film material (a silicon nitride film materials) 13, a buffer film material (an amorphous silicon film material) 20, and a stopper film material (a silicon nitride film materials) 18 (see FIG. 1-2).

The buffer film material 20 is stacked so that the relationship between the thickness of the buffer film material 20 and the trench width of a trench T, which is to be formed in a later step, in the word line direction ensures that the thickness of the buffer film material 20 becomes a thickness equivalent to not less than 0.5 times to not more than 1 time the width of the trench.

After that, a resist 19 is applied to the stopper film material 18 and a resist pattern 19a is formed by photolithography processing (see FIG. 1-3).

The stopper film material 18, the buffer film material 20, the charge film material 13, the tunnel insulating film material 12, and the silicon substrate 11 are sequentially etched by the reactive ion etching (RIE) method by use of the resist pattern 19a as a mask. A trench T is formed in this manner (see FIG. 1-4).

As a result of the formation of the trench T, the tunnel insulating film 12a, the charge film 13a, the buffer film 20a, and the stopper film 18a are formed.

Next, the resist pattern 19a is exfoliated (see FIG. 1-5).

After that, the element isolation insulating film (the silicon oxide film) 15 is deposited by the high density plasma (HDP) method so that at least the trench T is buried (see FIG. 1-6).

Furthermore, the element isolation insulating film 15 is planarized by being polished by the chemical mechanical polishing (CMP) method by use of the stopper film 18a as a mask, whereby the element isolation insulating film 15 is caused to remain in the trench T(see FIG. 1-7).

Next, the element isolation insulating film 15 is etched by the RIE method by use of the stopper film 18a as a mask until an upper surface of the element isolation insulating film 15 reaches a predetermined height (a height at a midpoint of the thickness of the stopper film 18a) (see FIG. 1-8).

After that, the stopper film 18a is exfoliated (see FIG. 1-9). As a result, as shown in FIG. 1-9, an upper portion of the element isolation insulating film 15 becomes higher than an upper surface of the buffer film 20a. That is, the upper portion of the element isolation insulating film 15 is brought into a condition in which this upper portion protrudes from the trench T.

Next, the element isolation insulating film 15 in an upward protruding condition is isotropically and selectively wet etched so that the upper surface of the element isolation insulating film 15 is positioned in the vicinity of an interface between the buffer film 20a and the charge film 13a (see FIG. 1-10). The etching amount at this time is at least in the same range as the film thickness of the buffer film 20a. On this occasion, dilute hydrofluoric acid is used as an etching solution having a high etching select ratio of the element isolation insulating film 15 to the buffer film 20a.

Next, the buffer film 20a is selectively removed by wet etching (see FIG. 1-11). On this occasion, an alkaline solution is used as an etching solution having a high etching select ratio of the buffer film 20a to both of the element isolation insulating film 15 and the charge film 13a.

After that, the element isolation insulating film 15 is wet etched so that an upper portion of a side wall thereof contacts with a side wall of the charge film 13a (see FIG. 1-12). A dilute hydrofluoric acid is used as the etching solution at this time.

After that, the common block film (the aluminum oxide film) 14, which is one continuous layer, is stacked so that the common block film covers an upper surface of the element isolation insulating film 15 and an upper surface and part of a side wall of the charge film 13a (see FIG. 1-13).

Next, a common control electrode film (a phosphorus-doped amorphous silicon film) 16 is formed on the common block film 14 (see FIG. 1-14).

Next, a cover film (a silicon nitride film) 17 is stacked on the common control electrode film 16 (see FIG. 1-15). After that, a plurality of memory cells MCs are formed by performing etching parallel to the word line direction.

A charge trap type non-volatile memory device as shown in FIG. 1-15, i.g., FIG. 1-1 can be finally obtained after steps as described above.

As a first modification of this embodiment, there can be an example in which during the wet etching of the element isolation insulating film 15 in the interior of the trench T, not only the element isolation insulating film 15, but also the buffer film 20a is simultaneously wet etched.

That is, as an illustration of the example, the condition of the device ranging from FIG. 1-9 to FIG. 1-11 can be realized by performing one processing step.

It is possible to reduce the number of steps compared to the first embodiment by doing this.

In order to enable the number of steps to be reduced in this manner, it is necessary to change the material for the buffer film 20. Concretely, a silicon oxide film is used in place of the amorphous silicon film used in the first embodiment.

In association with this change of the material, it is necessary to use dilute hydrofluoric acid or an NH4F solution having a high etching select ratio of a silicon oxide film to the charge film (the silicon nitride film) 13a.

Furthermore, in the deposition of the element isolation insulating film 15 in the interior of the trench T shown in FIG. 1-6 as a second modification to this embodiment, the deposition method is not limited to the HDP method used in the above-described embodiment, but it is also possible to cause the element isolation insulating film (the silicon oxide film) 15 to be deposited also by the chemical vapor deposition (CVD) method other than the HDP method. When the HDP method is used, the top surface of the element isolation insulating film 15 may sometimes be formed in a convex shape in the trench T. In contrast to this, when the CVD method other than the HDP method is used, the top surface of the element isolation insulating film 15 is formed in a concave shape in the trench T. For this reason, finally, it is possible to obtain a charge trap type non-volatile memory device as shown in FIG. 1-16.

The above-described first embodiment has advantages as described below.

That is, unlike the RIE method, the wet etching method provides isotropic etching. For this reason, it is possible to strictly control the etching amount by managing etching time.

Therefore, because this wet etching method is adopted in the embodiment of the present invention, it is possible to strictly control the etching amount by managing etching time.

In the etching of this embodiment, the buffer film 20a for the protection of etching is used as a reference plane and the element isolation insulating film 15 is dug by using the depth from the reference plane as a guideline (see FIG. 1-10).

However, if at this time the stopper film 18a is used as a reference plane in place of the buffer film 20a (see FIG. 1-8), then also the height of the element isolation insulating film 15 to be etched becomes nonuniform. The reason is as follows. That is, because the stopper film 18a is obtained by the polishing by CMP, the thickness of the film that provides a reference plane becomes apt to be nonuniform and as a result, it becomes difficult to make uniform the height of the top surface of the film to be etched.

Therefore, in this embodiment, before the wet etching of the element isolation insulating film 15, the stopper film 18a, which is a film obtained by CMP, is exfoliated (see FIG. 1-9). Furthermore, by using the buffer film 20a whose film thickness is controlled (see FIG. 1-9), as an etching protective film, it has become possible to position the height of the element isolation insulating film 15 with good accuracy.

In the common block film 14, the element isolation insulating film 15 and the common control electrode film 16 are electrically disconnected in a positive manner (see FIG. 1-15). As a result of this, a short circuit between the charge film 13a and the common control electrode film 16 can be prevented and it is possible to ensure a high breakdown voltage.

Second Embodiment

This second embodiment relates to a manufacturing method in which attention is paid also to a select gate section SGP in addition a memory cell array section MCR That is, in a charge trap type non-volatile memory device that is provided with a memory cell array section MCP having a plurality of memory cells MCs and a select gate section SGP having circuit elements (for example, select transistors TRs) that bring this memory cell array section MCP into action, a description will be given of a manufacturing method to be used when the memory cell array section MCP and the select gate section SGP are simultaneously fabricated, and in the memory cell array section MCP, each of the memory cells MCs has the same structure as the memory cell of the above-described first embodiment (see the left-hand part of FIG. 2-1).

The feature of this second embodiment is that although a memory cell array section MCP and a select gate section SGP are simultaneously formed by the same process, in the memory cell array section MCP an element isolation insulating film 25 in a trench T is positioned in a condition in which an upper portion of a side wall of the element isolation insulating film 25 contacts with a side wall of the charge film 23a in the memory cell MC (see the left-hand part of FIG. 2-1).

Furthermore, in order to ensure that as described above the height of the element isolation insulating film 25 in the trench T is a predetermined height in the same manner as in the first embodiment, in the second embodiment an etching protective film 31a and a buffer film 32a are used in place of the buffer film 20a of one layer used in the first embodiment. The second embodiment differs from the first embodiment in this point.

First, a description will be given of the structure of the charge trap type non-volatile memory device in the second embodiment.

As described earlier, a schematic top view of the charge trap type non-volatile memory device in the second embodiment is made in the same manner as FIG. 3. The description of FIG. 3 is omitted here.

Bit lines 60 are omitted in FIG. 2-1 to FIG. 2-18.

FIG. 2-1 shows a section of part of a memory cell array section MCP and part of a select gate section SGP in the charge trap type non-volatile memory device of the second embodiment, which is obtained by being cut along the word line direction.

As shown in FIG. 2-1, the charge trap type non-volatile memory device in this embodiment is provided with a memory cell array section MCP and a select gate section SGP. The memory cell array section MCP has a plurality of memory cells MCs formed at a predetermined interval via an element isolation insulating film 25 along the word line direction, and each of the memory cells MCs is formed by a tunnel insulating film (a silicon oxide film) 22*a* formed on a silicon substrate 21*a*, a charge film (a silicon nitride film) 23*a* formed on the tunnel insulating film 22*a*, a common block film (an aluminum oxide film) 24 formed on the charge film 23*a*, a common control electrode film (a phosphorus-doped amorphous silicon film) 26 formed on the common block film 24, and a cover film (a silicon nitride film) 27 formed on the common electrode film 26. The select gate section SGP has circuit elements that bring the memory cell array section MCP into action, for example, select transistors TRs. The select transistors TRs are formed at a predetermined interval via the element isolation insulating film 25 along the word line direction. Furthermore, each of the select transistors TRs is formed by a select gate insulating film (a silicon oxide film) 33 formed on a silicon substrate 21*b*, a common block film (an aluminum oxide film) 24 formed on the select gate insulating film 33, a common control electrode film (a phosphorus-doped amorphous silicon film) 26 formed on the common block film 24, and a cover film (a silicon nitride film) 27 formed on the common control electrode film 26.

Next, the manufacturing process of the charge trap type non-volatile memory device of the second embodiment will be described in order of steps with reference to FIG. 2-2 to FIG. 2-18.

The drawings of FIG. 2-2 to FIG. 2-18 show the transition of sectional shapes obtained in each of the manufacturing steps for the charge trap type non-volatile memory device of this embodiment, and show sections of part of a region A where a memory cell array section is to be formed and part of a region B where a select gate section is to be formed in the charge trap type non-volatile memory device, which are obtained by being cut along the word line direction. The region A where a memory cell array section is to be formed and the region B where a select gate section is to be formed, which are shown in the figures, become a memory cell array section MCP and a select gate section SGP, respectively, after the completion of the charge trap type non-volatile memory device.

First, in both of the region A where a memory cell array section is to be formed and the region B where a select gate section is to be formed, in almost the same manner in the first embodiment, upon the silicon substrate 21 there are sequentially formed a tunnel insulating film material (a silicon oxide film material) 22, a charge film material (a silicon nitride film materials) 23, an etching protective film material (a silicon oxide film material) 31, a buffer film material (an amorphous silicon film material) 32, and a stopper film material (a silicon nitride film material) 28 (see FIG. 2-2).

At this time, the buffer film material 32 is stacked so that the relationship between the thickness of the buffer film material 32 and the trench width of a trench T, which is to be formed in a later step, in the word line direction ensures that the thickness of the buffer film material 32 becomes a thickness equivalent to not less than 0.5 times to not more than 1 time as large as the width of the trench.

Subsequently, a resist 29 is applied to the stopper film material 28 and a resist pattern 29*a* is formed by photolithography processing (see FIG. 2-3).

After that, the stopper film material 28, the buffer film material 32, the etching protective film material 31, the charge film material 23, the tunnel insulating material 22, and the silicon substrate 21 are sequentially etched by the RIE method by use of the resist pattern 29*a* as a mask. A trench T is formed in this manner (see FIG. 2-4).

As a result of the formation of this trench T, in the region A where a memory cell array section is to be formed, there are obtained a stopper film of memory cell 28*a*, a buffer film of memory cell 32*a*, an etching protective film of memory cell 31*a*, the charge film of memory cell 23*a*, and the tunnel insulating film of memory cell 22*a* (see the left-hand part of FIG. 2-4).

Furthermore, in the region B where a select gate section is to be formed, as a result of the formation of the trench T, there are obtained a stopper film of transistor 28*b*, a buffer film of transistor 32*b*, an etching protective film of transistor 31*b*, a charge film of transistor 23*b*, and a tunnel insulating film of transistor 22*b* (see the right-hand part of FIG. 2-4).

Next, in both of the region A where a memory cell array section is to be formed and the region B where a select gate section is to be formed, the resist pattern 29*a* is exfoliated and subsequently, an element isolation insulating film (a silicon oxide film) 25 is deposited by the HDP method so that the trench T is buried (see FIG. 2-5).

Furthermore, in both of the region A where a memory cell array section is to be formed and the region B where a select gate section is to be formed, the element isolation insulating film 25 is planarized by being polished by the CMP method, whereby the element isolation insulating film 25 is caused to remain in the trench T (see FIG. 2-6).

Next, in both of the region A where a memory cell array section is to be formed and the region B where a select gate section is to be formed, the element isolation insulating film 25 is etched by the RIE method by use of the stopper film for memory cell 28*a* and the stopper film for transistor 28*b* as a mask until an upper surface of the element isolation insulating film 25 reaches a predetermined height (a height at a midpoint of the thickness of the stopper film for memory cell 28*a* and of the stopper film for transistor 28*b*) (see FIG. 2-7).

After that, in both of the region A where a memory cell array section is to be formed and the region B where a select gate section is to be formed, the stopper film for memory cell 28*a* and the stopper film for transistor 28*b* are exfoliated (see FIG. 2-8).

As a result, as shown in FIG. 2-8, an upper portion of the element isolation insulating film 25 becomes higher than upper surfaces of the buffer film of memory cell 32*a* and the buffer film of transistor 32*b*. That is, the upper portion of the element isolation insulating film 25 is brought into a condition in which this upper portion protrudes from the trench T (see FIG. 2-8).

Next, in the region A where a memory cell array section is to be formed, the element isolation insulating film 25 in an upward protruding condition is isotropically and selectively wet etched so that the upper surface of the element isolation insulating film 25 is positioned in the vicinity of an interface between the buffer film of memory cell 32*a* and the etching protective film of memory cell 31*a* (see the left-hand part of FIG. 2-9).

At the same time, in the region B where a select gate section is to be formed, the element isolation insulating film 25 in an upward protruding condition is isotropically and selectively wet etched so that the upper surface of the element isolation insulating film 25 is positioned in the vicinity of an interface between the buffer film of transistor 32b and the etching protective film of transistor 31b (see the right-hand part of FIG. 2-9).

On this occasion, dilute hydrofluoric acid is used which is an etching solution having a high etching select ratio of the element isolation insulating film 25 to the buffer film of memory cell 32a and the buffer film of transistor 32b.

Next, in both of the region A where a memory cell array section is to be formed and the region B where a select gate section is to be formed, the buffer film of memory cell 32a and the buffer film of transistor 32b are selectively removed by wet etching (see FIG. 2-10).

On this occasion, an alkaline solution is used as an etching solution having a high etching select ratio of the buffer film of memory cell 32a and the buffer film of transistor 32b to the element isolation insulating film 25, the charge film of memory cell 23a, and the charge film of transistor 23b.

After that, in the region A where a memory cell array section is to be formed, a protective film (a resist film) 34 is formed in order to protect the region A where a memory cell array section is to be formed (see the left-hand part of FIG. 2-11).

Thereafter, the step of processing only the region B where a select gate section is to be formed is started. That is, in the region B where a select gate section is to be formed, the etching protective film of transistor 31b, the charge film of transistor 23b, and the element isolation insulating film 25 are etched by the RIE method (see the right-hand part of FIG. 2-12).

Subsequently, in the region A where a memory cell array section is to be formed, the protective film 34 is exfoliated (see the left-hand part of FIG. 2-13).

In both of the region A where a memory cell array section is to be formed and the region B where a select gate section is to be formed, the element isolation insulating film 25, the etching protective film of memory cell 31a, and the tunnel insulating film of transistor 22b are wet etched by using dilute hydrofluoric acid (see FIG. 2-14).

As a result of this, in the region A where a memory cell array section is to be formed, the etching protective film of memory cell 31a is removed and the upper portion of the side wall of the element isolation insulating film 25 in the trench T contacts with the side wall of the charge film for memory cell 23a (see the left-hand part of FIG. 2-14).

At the same time, in the region B where a select gate section is to be formed, the tunnel insulating film of transistor 22b is removed and the height of the upper surface of the element isolation insulating film 25 in the trench T lowers (see the right-hand part of FIG. 2-14).

On this occasion, in the region A where a memory cell array section is to be formed, the etching protective film of memory cell 31a protects the charge film of memory cell 23a present just thereunder because the etching protective film of memory cell 31a itself is etched.

After that, in the region B where a select gate section is to be formed, a gate insulating film of transistor (a silicon oxide film) 33 is formed by oxidizing an upper portion of the silicon substrate of transistor 21b (see the right-hand part of FIG. 2-15). On this occasion, in the region A where a memory cell array section is to be formed, the charge film of memory cell 23a is not oxidized because the charge film of memory cell 23a is a silicon nitride film (see the left-hand part of FIG. 2-15).

Next, in both of the region A where a memory cell array section is to be formed and the region B where a select gate section is to be formed, the common block film (the aluminum oxide film) 24, which is one continuous layer, is stacked so that the common block film covers the upper surface of the element isolation insulating film 25, the upper surface and part of a side wall of the charge film 23a, and an upper surface and part of a side wall of the gate insulating film of transistor 33 (see FIG. 2-16).

Furthermore, in both of the region A where a memory cell array section is to be formed and the region B where a select gate section is to be formed, the common control electrode film (the phosphorus-doped amorphous silicon film) 26 is stacked on the common block film 24 (see FIG. 2-17).

Subsequently, in both of the region A where a memory cell array section is to be formed and the region B where a select gate section is to be formed, the cover film (the silicon nitride film) 27 is stacked on the common control electrode film 26 (see FIG. 2-18). After that, a plurality of memory cells MCs are formed by performing etching parallel to the word line direction.

A charge trap type non-volatile memory device as shown in FIG. 2-18, i.g., FIG. 2-1 can be finally obtained after steps as described above.

In the second embodiment, as described above, the buffer film 32a and the etching protective film 31a are used in order to obtain a predetermined height of the element isolation insulating film 25 in the trench T in the memory cell array section MCP while simultaneously processing the memory cell array section MCP and the select gate section SGP (see FIG. 2-9). More specifically, as is apparent from FIG. 2-9, during the etching of the element isolation insulating film 25 in the region A where a memory cell array section is to be formed, the buffer film 32a functions as a protective film of the charge film for memory cell 23a in the same manner as the buffer film 20a of the first embodiment described above. Furthermore, as is apparent from FIG. 2-14, also during the processing of the region B where a select gate section is to be formed, in the region A where a memory cell array section is to be formed, the etching protective film 31a works as a protective film of the charge film of memory cell 23a because the etching protective film 31a itself is etched.

By ensuring the foregoing, according to this second embodiment, it was possible to simultaneously process the memory cell array section MCP and the select gate section SGP by the same single process as described above.

According to the first and second embodiments described above, it is possible to lower the height of the middle portion of the upper surface of the element isolation insulating film in the trench at least to under the position of the upper surface of the charge film in the memory cell and, therefore, it is possible to reduce the mutual interference of the memory cells. Furthermore, the common block film is stacked as one continuous layer after the formation of a STI structure, whereby the element isolation insulating film and the common control electrode film are partitioned from each other by the common block film and hence it is possible to avoid the occurrence of a short circuit between the control electrode film and the charge film. Furthermore, because there is no remaining portion of the insulating film that might protrude from the trench in the upper end portion of the element isolation insulating film (see 5a of FIG. 3), electric field losses do not occur and this makes it possible to ensure good memory cell characteristics.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A charge trap type non-volatile memory device, comprising:
    memory cells formed on a silicon substrate at a predetermined interval via an element isolation trench along a first direction in which word lines extend, each of the memory cells having a tunnel insulating film formed on the silicon substrate, a charge film formed on the tunnel insulating film, and a common block film formed on the charge film; and
    element isolation insulating films each buried in the element isolation trench between the memory cells,
    wherein:
        each of the common block films is formed on the charge films and the element isolation insulating film,
        an upper surface of the element isolation insulating film is positioned between upper and lower surfaces of the charge film, to form a recess defined by the upper surface of the element isolation insulating film and two side walls of the charge films of two neighboring memory cells opposing to each other via the element isolation trench,
        each of the common block films has a protruding portion that protrudes downward and fits in the recess, and
        a central portion of an upper surface of the element isolation insulating film is higher than a peripheral portion of the upper surface thereof.

2. A charge trap type non-volatile memory device, comprising:
    memory cells formed on a silicon substrate at a predetermined interval via an element isolation trench along a first direction in which word lines extend, each of the memory cells having a tunnel insulating film formed on the silicon substrate, a charge film formed on the tunnel insulating film, and a common block film formed on the charge film; and
    element isolation insulating films each buried in the element isolation trench between the memory cells,
    wherein:
        each of the common block films is formed on the charge films and the element isolation insulating film,
        an upper surface of the element isolation insulating film is positioned between upper and lower surfaces of the charge film, to form a recess defined by the upper surface of the element isolation insulating film and two side walls of the charge films of two neighboring memory cells opposing to each other via the element isolation trench,
        each of the common block films has a protruding portion that protrudes downward and fits in the recess, and
        a central portion of an upper surface of the element isolation insulating film is lower than a peripheral portion of the upper surface thereof.

3. The charge trap type non-volatile memory device according to claim 2, wherein the control electrode film is a word line.

4. The charge trap type non-volatile memory device according to claim 2, wherein each set of the memory cells arranged in line along the first direction constitutes each of memory cell units, the memory cell units being arranged in line along a second direction orthogonal to the first direction, and the memory cells of the memory cell units being arranged in a matrix form.

5. The charge trap type non-volatile memory device according to claim 4, wherein two element isolation insulating films adjacent to each other along the second direction, are sequentially combined to each other.

6. The charge trap type non-volatile memory device according to claim 4,
    wherein each set of the memory cells arranged in line along the second direction constitutes a memory cell group,
    a pair of memory cells adjacent to each other along the second direction in each of the memory cell groups being connected by a common source/drain region to each other, and thereby the memory cells in each of the memory cell groups being sequentially connected along the second direction,
    a select gate section being formed at least one end of the memory cell groups,
    the select gate section comprising select gate transistors formed at a predetermined interval along the first direction, and
    each of the select gate transistors being connected by a common source/drain region to the memory cell at one end of each of the corresponding memory cell groups.

7. The charge trap type non-volatile memory device according to claim 6,
    wherein in the select gate section, a select gate transistor isolation trench is formed between each pair of select gate transistors adjacent to each other along the first direction, and a select gate transistor isolation insulating film is formed in the select gate transistor insulation trench,
    each of the select gate transistor isolation insulating films being formed integrally with each of the corresponding element isolation insulating films that extend along the second direction.

8. A method for manufacturing a charge trap type non-volatile memory device having memory cells formed on a silicon substrate at a predetermined interval via an element isolation trench along a first direction in which word lines extend, comprising:
    stacking at least a tunnel insulating film material, a charge film material, and a buffer film material on the silicon substrate;
    forming the element isolation trenches that extend from the buffer film material to the silicon substrate by etching the buffer film material, the charge film material, the tunnel insulating film material, and the silicon substrate;
    forming each of the memory cells as a memory cell having a tunnel insulating film, a charge film, and a buffer film that covers the charge film;
    depositing an element isolation insulating film in each of the element isolation trenches;
    etching each of the element isolation insulating films so that an upper surface of each of the element isolation insulating films comes near to an interface between each of the buffer films and each of the charge films;
    removing each of the buffer films; and
    etching each of the element isolation insulating films so that an upper portion of a side wall of each of the element isolation insulating films contacts with a side wall of the charge film in each of the memory cells.

9. The method for manufacturing a charge trap type non-volatile memory device according to claim 8, wherein the buffer film material is formed in such a manner that the thickness thereof becomes not less than 0.5 times to not more than 1 time the width of the element isolation trench.

10. The method for manufacturing a charge trap type non-volatile memory device according to claim 8, wherein as the buffer film material amorphous silicon or silicon oxide is used.

11. The method for manufacturing a charge trap type non-volatile memory device according to claim 8,
wherein each of the common block films is stacked so that a lower surface of each of the common block films contacts with an upper surface of each of the charge films,
each of the control electrode films being stacked on each of the common block films.

12. A method for manufacturing a charge trap type non-volatile memory device having memory cells formed on a silicon substrate at a predetermined interval via an element isolation trench along a first direction in which word lines extend, comprising:
stacking at least a tunnel insulating film material, a charge film material, an etching protective film material, and a buffer film material on the silicon substrate;
forming the element isolation trenches that extend from the buffer film material to the silicon substrate by etching the buffer film material, the etching protective film material, the charge film material, the tunnel insulating film material, and the silicon substrate;
forming each of the memory cells as a memory cell having a tunnel insulating film, a charge film, and an etching protective film and a buffer film that cover the charge film;
depositing each of the element isolation insulating films in each of the element isolation trenches;
etching each of the element isolation insulating films so that an upper surface of each of the element isolation insulating films comes near to an interface between each of the buffer films and each of the etching protective films;
removing each of the buffer films and each of the etching protective films; and
etching each of the element isolation insulating films so that an upper portion of a side wall of each of the element isolation insulating films contacts with a side wall of each of the charge films.

13. The method for manufacturing a charge trap type non-volatile memory device according to claim 12, wherein the buffer film material is formed in such a manner that the thickness thereof becomes not less than 0.5 times to not more than 1 time the width of the element isolation trench.

14. The method for manufacturing a charge trap type non-volatile memory device according to claim 12, wherein as the buffer film material amorphous silicon is used.

15. The method for manufacturing a charge trap type non-volatile memory device according to claim 12, wherein as the etching protective film material silicon oxide is used.

16. The method for manufacturing a charge trap type non-volatile memory device according to claim 12, wherein each of the common block films is stacked so that a lower surface of each of the common block films contacts with an upper surface of each of the charge films,
each of the control electrode films being stacked on each of the common block films.

17. A method for manufacturing a charge trap type non-volatile memory device having:
a memory cell array section comprising memory cells formed on a silicon substrate at a predetermined interval via an element isolation trench along a first direction in which word lines extend; and
a select gate section comprising select gate transistors formed on the silicon substrate at a predetermined interval via a select gate transistor isolation trench along the first direction, comprising:
stacking at least a tunnel insulating film material, a charge film material, an etching protective film material, and a buffer film material on the silicon substrate in both of the memory cell array section and the select gate section;
etching the buffer film material, the etching protective film material, the charge film material, the tunnel insulating film material, and the silicon substrate in both of the memory cell array section and the select gate section so that:
forming the element isolation trenches of the memory cell array section extend from the buffer film material to the silicon substrate, and forming each of the memory cells having a tunnel insulating film, a charge film, and an etching protective film and a buffer film that cover the charge film; and
forming the select gate transistor isolation trenches of the select gate section extend from the buffer film material to the silicon substrate, and forming each of the select gate transistors having a tunnel insulating film, a charge film, and an etching protective film and a buffer film that cover the charge film;
depositing an insulating film material in the element isolation trenches of the memory cell array section and in the select gate transistor isolation trenches of the select gate section, and thereby forming the element isolation insulating films of the memory cell array section and the select gate transistor isolation insulating films of the select gate section;
etching each of the element isolation insulating films and each of the select gate transistor isolation insulating films so that an upper surface of each of the element isolation insulating films in the memory cell array section and an upper surface of each of the select gate transistor isolation insulating films in the select gate section come near to an interface between the buffer film and the etching protective film;
removing the buffer films in both of the memory cell array section and the select gate section;
removing the charge films and the etching protective films in the select gate section;
removing the etching protective films in the memory cell array section and etching each of the element isolation insulating films so that an upper portion of a side wall of each of the element isolation insulating films in the memory cell array section contacts with a side wall of each of the charge films; and
removing the tunnel insulating films in the select gate section.

18. The charge trap type non-volatile memory device according to claim 1, wherein the control electrode film is a word line.

19. The charge trap type non-volatile memory device according to claim 1, wherein each set of the memory cells arranged in line along the first direction constitutes each of memory cell units, the memory cell units being arranged in line along a second direction orthogonal to the first direction, and the memory cells of the memory cell units being arranged in a matrix form.

20. The charge trap type non-volatile memory device according to claim 19, wherein two element isolation insulating films adjacent to each other along the second direction, are sequentially combined to each other.

* * * * *